(12) United States Patent
Okubo et al.

(10) Patent No.: US 8,729,387 B2
(45) Date of Patent: May 20, 2014

(54) ORGANIC PHOTOELECTRIC CONVERSION ELEMENT, SOLAR CELL AND OPTICAL SENSOR ARRAY

(75) Inventors: Yasushi Okubo, Tokyo (JP); Takahiko Nojima, Tokyo (JP); Hiroaki Itoh, Tokyo (JP); Ayako Wachi, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 626 days.

(21) Appl. No.: 12/934,826

(22) PCT Filed: Aug. 21, 2009

(86) PCT No.: PCT/JP2009/064627
§ 371 (c)(1),
(2), (4) Date: Sep. 27, 2010

(87) PCT Pub. No.: WO2010/021374
PCT Pub. Date: Feb. 25, 2010

(65) Prior Publication Data
US 2011/0036406 A1 Feb. 17, 2011

(30) Foreign Application Priority Data
Aug. 22, 2008 (JP) .................................. 2008213781

(51) Int. Cl.
H01L 31/00 (2006.01)
H01L 29/08 (2006.01)
H01L 35/24 (2006.01)
H01L 51/00 (2006.01)

(52) U.S. Cl.
USPC 136/263; 257/40; 257/E51.027; 257/E51.039; 977/734; 977/735; 977/954; 977/948

(58) Field of Classification Search
USPC ............. 136/263; 257/40, E51.027, E51.039; 977/734, 735, 954, 948
See application file for complete search history.

(56) References Cited

U.S. PATENT DOCUMENTS

2008/0149178 A1* 6/2008 Reyes-Reyes et al. ....... 136/263
2009/0308458 A1* 12/2009 Aramaki et al. ............. 136/263

FOREIGN PATENT DOCUMENTS

| JP | 2005158972 | 6/2005 |
| JP | 4067115 | 1/2006 |
| JP | 200816834 | 1/2008 |
| JP | 2008109112 | 5/2008 |
| WO | 2004057674 | 7/2004 |
| WO | 2004073082 | 8/2004 |

OTHER PUBLICATIONS

Drees et al., Stabilization of the nanomorphology of polymer-fullerene bulk heterojunction blends using a novel polymerizable fullerene derivative, J. Mater. Chem., 2005, 15, 5158-5163.*

(Continued)

Primary Examiner — Jonathan Johnson
Assistant Examiner — Angelo Trivisonno
(74) Attorney, Agent, or Firm — Lucas & Mercanti, LLP

(57) ABSTRACT

Disclosed is an organic photoelectric conversion element having high photoelectric conversion efficiency and high durability. Also disclosed are a solar cell and an optical sensor array, each using the organic photoelectric conversion element. The organic photoelectric conversion element comprises a bulk heterojunction layer wherein an n-type semiconductor material and a p-type semiconductor material are mixed. The organic photoelectric conversion element is characterized in that the n-type semiconductor material is a polymer compound and the p-type semiconductor material is a low-molecular-weight compound.

14 Claims, 3 Drawing Sheets

(56) References Cited

OTHER PUBLICATIONS

Lenes et al., Fullerene Bisadducts for Enhanced Open-Circuit Voltages and Efficiencies in Polymer Solar Cells, Adv. Mater. 2008, 20, 2116-2119.*

Kooistra, Fullerenes for Organic Electronics, PhD thesis Groningen University, 2007.*

Japanese Office Action, Notice of Reasons for Refusal, Patent Application No. 2010-525711.

English translation of Japanese Office Action, Notice of Reasons for Refusal, Patent Application No. 2010-525711.

* cited by examiner

ORGANIC PHOTOELECTRIC CONVERSION ELEMENT, SOLAR CELL AND OPTICAL SENSOR ARRAY

This is a 371 of PCT/JP2009/064627 filed Aug. 21, 2009 which in turn claimed the priority of Japanese Patent Application No. 2008-213781 filed Aug. 22, 2008, both applications are incorporated by reference herein.

TECHNICAL FIELD

This invention relates to an organic photoelectric conversion element of a bulk heterojunction type, a solar cell and an optical sensor array using this organic photoelectric conversion element.

BACKGROUND

In Journal of the America Chemical Society 115 (1993) 6382, Gratzel and others reported a dye sensitized photoelectric conversion element (Gratzel cell). This cell was made by forming a film of an organic dye which had a photoelectric conversion function on a transparent electrode, such as a titanium oxide, followed by filling between electrodes with an electrolyte. It was reported that this cell exhibited a similar performance to an amorphous silicon photoelectric conversion element.

However, since this dye sensitized photoelectric conversion element is a wet solar cell which performs electrical junction with a counter electrode with a liquid redox electrolyte, if it is used for a long period of time, a photoelectric conversion function will fall remarkably by exhaustion of an electrolyte, and consequently, it may stop functioning as a photoelectric conversion element.

Then, as a photoelectric conversion element which uses no electrolyte and which can be prepared by a cost saving solution coating method, it is proposed an organic photoelectric conversion element equipped with a bulk heterojunction layer, for example, in Patent document 1. This is a heterojunction (laminated type) element which sandwiches an electron donor layer (a p-type semiconductor layer) and an electron acceptor layer (an n-type semiconductor layer) between a transparent electrode and a counter electrode, or an element which sandwiches a p-type semiconductor polymer and an n-type semiconductor material between a transparent electrode and a counter electrode.

The operation principle of these photoelectric conversion elements will be described. First, an exciton generated by photoexcitation moves from a p-type semiconductor layer to an interface of an n-type semiconductor layer, and this exciton supplies an electron acceptor layer with an electron. Thereby, a positive hole is generated in the p-type semiconductor layer, and an electron is generated in the n-type semiconductor layer. And the positive hole is carried to one electrode through the p-type semiconductor layer by an internal electric field, and the electron is carried to another electrode through the n-type semiconductor layer. As a result, a photocurrent is observed.

However, in the heterojunction type photoelectric conversion element, unlike a Si type photoelectric conversion element, since the lifetime of the positive hole and the electron is short and their mobility is low, the positive hole and the electron generated will be deactivated before reaching an anode and a cathode, respectively. And there is a problem that an electric charge cannot be taken out to result in failing to improve photoelectric conversion efficiency.

A non-patent document 1 is cited as a literature which analyzed the reason of this effect. In this literature, it is reported that the maximum photoelectric conversion efficiency is obtained in the portion where the mobility of a p-type semiconductor layer and an n-type semiconductor layer is almost equal in a bulk heterojunction type organic photoelectric conversion element.

Generally, as an organic semiconductor material, it is known that mobility of a low molecular weight material is higher than a polymer material. From a viewpoint of mobility, it is advantageous to use a low molecular weight material for both a p-type semiconductor material and an n-type semiconductor material. There is a report which uses a low molecular weight material for both a p-type semiconductor material and an n-type semiconductor material (Patent document 2), however, when combination of low molecular weight materials is used for preparing a coated organic photoelectric conversion element, one of the materials will take a discontinuous structure, and formation of a carrier path which transmits a positive hole or an electron to an electrode is difficult, and a high efficient organic photoelectric conversion element has not been not obtained.

On the other hand, an approach of balancing the mobility of a p-type semiconductor material and an n-type semiconductor material is also disclosed by making both a p-type semiconductor material and an n-type semiconductor material a polymer (Patent document 3). However, when both of them are polymer materials, both of mobility will fall and, high photoelectric conversion efficiency has not been acquired.

Moreover, it is also expected to improve its lifetime of the organic bulk heterojunction photoelectric conversion element. In the process in which the carriers generated by receiving light are deactivated without reaching an electrode by recombination, deterioration of materials or increase of a carrier trap site occurs, and it is thought that it will cause deterioration of efficiency. Then, it is thought that it is required to improve the mobility simultaneously while the mobility of a p-type semiconductor layer and an n-type semiconductor layer are kept almost equivalent in order to achieve a higher efficiency and a longer lifetime.

PRIOR ART DOCUMENTS

Patent Documents

Patent document 1: Japanese Patent No. 4067115
Patent document 2: Japanese Patent Application Publication (JP-A) No. 2008-16834
Patent document 3: JP-A No. 2005-158972

Non-Patent Document

Non-patent document 1: Appl. Phys. Lett., vol. 87 (2005), P. 132105

SUMMARY OF THE INVENTION

Problems to be Solved by the Invention

The present invention is made in view of the above-mentioned problems. An object of the present invention is to provide an organic photoelectric conversion element exhibiting high photoelectric conversion efficiency and high durability, and also to provide a solar cell and an optical sensor array using this organic photoelectric conversion element.

Means to Solved the Problems

The above-mentioned problems of the present invention are resolved by the following compositions.

1. An organic photoelectric conversion element comprising a bulk heterojunction layer containing a mixture of an n-type semiconductor material and a p-type semiconductor material, wherein the n-type semiconductor material is a polymer and the p-type semiconductor material is a low molecular weight material.

2. The organic photoelectric conversion element described in the foregoing item 1, wherein the n-type semiconductor material is a polymer containing a fullerene compound.

3. The organic photoelectric conversion element described in the foregoing item 2, wherein the polymer containing a fullerene compound is a polymer which contains a fullerene structure in a main chain of the polymer.

4. The organic photoelectric conversion element described in the foregoing item 2, wherein the polymer containing a fullerene compound is represented by the following Formula (1).

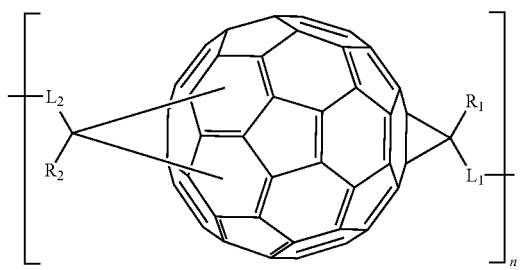

Formula (1)

(In Formula, $R_1$ and $R_2$ each represent a substituent selected from the group consisting of a substituted or unsubstituted alkyl group, cycloalkyl group, aralkyl group, aryl group, heteroaryl group and silyl group; $L_1$ and $L_2$ each represent a substituted or unsubstituted alkylene group, alkenediyl group, alkynediyl group, cycloalkylene group, arylene group, heteroarylene group, silylene group, ether group, thioether group, carbonyl group, carboxyl group, amino group, amide group, or a structure containing a plurality of the foregoing groups connected with each other; and n is an integer of 2 or more, provided that Formula shows one hemispherical portion among a spherical fullerene structure and the other hemispherical portion is omitted, and a spatial relationship of a first substituent containing $R_1$ and $L_1$ to a second substituent containing $R_2$ and $L_2$ in the fullerene structure is arbitrary.)

5. The organic photoelectric conversion element described in any one of the foregoing items 2 to 4, wherein the polymer containing a fullerene compound forms a three-dimensional network structure.

6. The organic photoelectric conversion element described in the foregoing item 5, wherein the polymer containing a fullerene compound which forms a three-dimensional network structure is a compound made by cross-linking polymerization using a monomer represented by the following Formula (2).

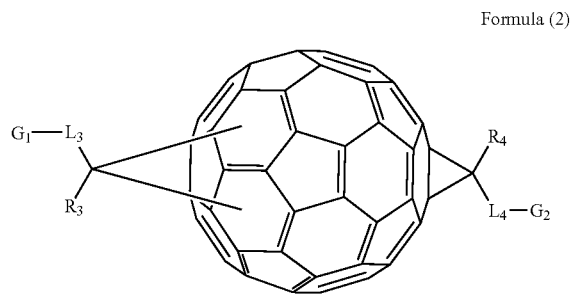

Formula (2)

(In Formula, $R_3$ and $R_4$ each represent a substituent selected from the group consisting of a substituted or unsubstituted alkyl group, cycloalkyl group, aralkyl group, aryl group, heteroaryl group and silyl group; $L_3$ and $L_4$ each represent a substituted or unsubstituted alkylene group, alkenediyl group, alkynediyl group, cycloalkylene group, arylene group, heteroarylene group, silylene group, ether group, thioether group, carbonyl group, carboxyl group, amino group, amide group, or a structure containing a plurality of the said groups connected with each other; and $G_1$ and $G_2$ each represent a polymerizable group which forms a linking chain of a three-dimensional network structure, provided that Formula shows one hemispherical portion among a spherical fullerene structure and the other hemispherical portion is omitted, and a spatial relationship of a first substituent containing $G_1$, $R_3$ and $L_3$ to a second substituent containing $G_2$, $R_4$ and $L_4$ in the fullerene structure is arbitrary.)

7. The organic photoelectric conversion element described in the foregoing item 6, wherein $G_1$ and $G_2$ in Formula (2) are a vinyl group.

8. The organic photoelectric conversion element described in any one of the foregoing items 1 to 7, wherein the p-type semiconductor material is a compound formed by heating a p-type semiconductor material precursor to change a chemical structure to convert into the p-type semiconductor material.

9. The organic photoelectric conversion element described in any one of the foregoing items 1 to 8, wherein the p-type semiconductor material is a tetrabenzoporphyrin derivative.

10. The organic photoelectric conversion element described in any one of the foregoing items 1 to 9, wherein the bulk heterojunction layer is made from a solution dissolving:
    the p-type semiconductor material or a precursor thereof; and
    the n-type semiconductor material or a precursor thereof.

11. The organic photoelectric conversion element described in the foregoing item 10, wherein the bulk heterojunction layer is made by the steps of:
    forming a layer using a solution dissolving:
    the p-type semiconductor material or a precursor thereof; and
    the n-type semiconductor material or a precursor thereof, and heating the formed layer.

12. The organic photoelectric conversion element described in any one of the foregoing items 1 to 11, comprising a multiplicity of the bulk heterojunction layers.

13. A solar cell comprising the organic photoelectric conversion element described in any one of the foregoing items 1 to 12.

14. An optical sensor array comprising the organic photoelectric conversion element described in any one of the foregoing items 1 to 12 arranged in an array structure.

Effects of the Invention

The present invention made it possible to provide an organic photoelectric conversion element exhibiting high photoelectric conversion efficiency and high durability, and also to provide a solar cell and an optical sensor array using this organic photoelectric conversion element.

EMBODIMENTS TO CARRY OUT THE INVENTION

In the above-mentioned non-patent document 1, the present inventors noticed the following report. It was reported that when P3HT which was a p-type semiconductor material often used conventionally and PCBM which was a p-type semiconductor material were compared, a simple substance PCBM exhibited a higher mobility.

Namely, the present inventors found out to obtain an organic photoelectric conversion element exhibiting high photoelectric conversion efficiency and high durability by the following structure. A low molecular weight material was used as a p-type semiconductor material which exhibited low mobility when used alone, and a polymer material was used as an n-type semiconductor material which exhibited high mobility when used alone. By making this structure, it became possible to balance each mobility with high precision when the p-type and n-type semiconductor materials were mixed compared with a conventionally known combination.

Hereafter, the present invention will be described in details.
(Compositions of Organic Photoelectric Conversion Element and Solar Cell)

Figure 1:
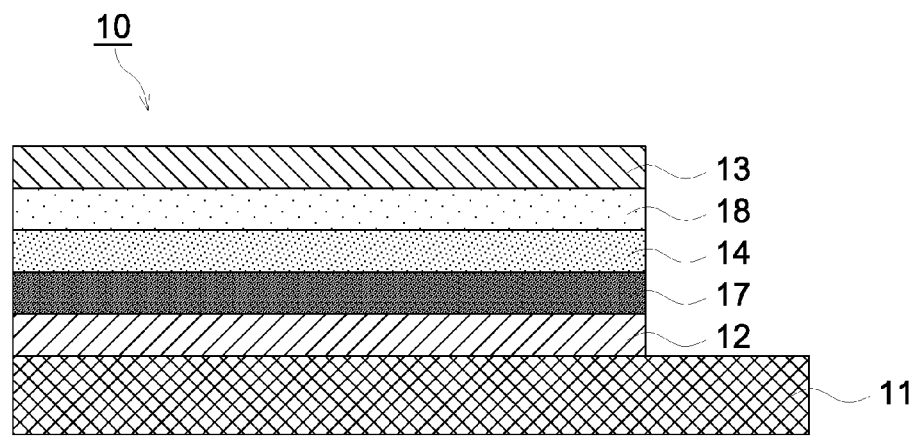
FIG. 1 is a cross-sectional view showing a solar cell having an organic photoelectric conversion element of a bulk heterojunction type.
Figure 2:
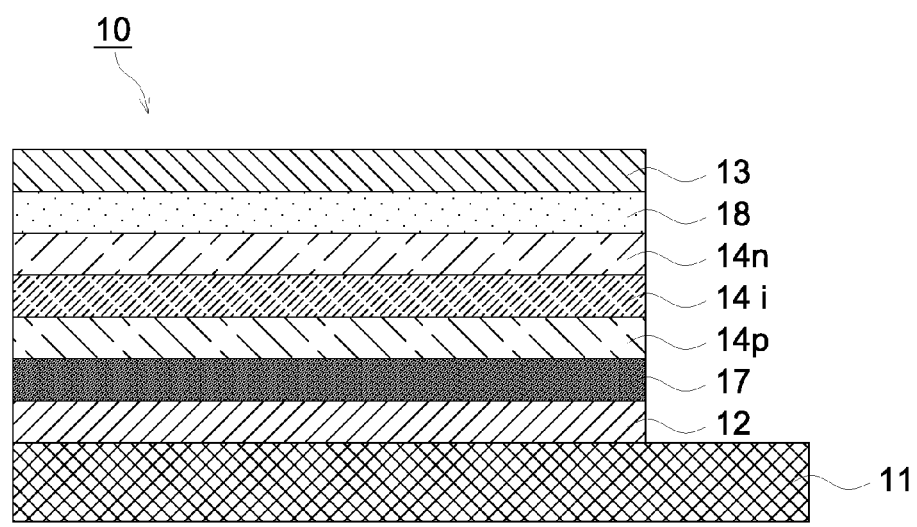
FIG. 2 is a cross-sectional view showing a solar cell having an organic photoelectric conversion element equipped with a photoelectric conversion layer structure containing three laminated layers of p-i-n.

FIG. 1 is a cross-sectional view showing a solar cell having an organic photoelectric conversion element of a bulk heterojunction type. In FIG. 1, organic photoelectric conversion element 10 of a bulk heterojunction type has a successively laminated structure on one surface of substrate 11: transparent electrode 12 (generally, an anode), positive hole transport layer 17, photoelectric conversion layer 14, electron transport layer 18 and counter electrode 13 (generally a cathode).

Substrate 11 is a member holding successively laminated members of: transparent electrode 12, photoelectric conversion layer 14 and counter electrode 13. In this embodiment, since the incident light by which photoelectric conversion is carried out enters from the substrate 11 side, the substrate 11 is a member which enables to pass through this light by which photoelectric conversion is carried out, i.e., it is a transparent member to the wave length of this light that should be carried out photoelectric conversion. As for substrate 11, a glass substrate and a resin substrate are used, for example. This substrate 11 is not indispensable. For example, organic photoelectric conversion element 10 of a bulk heterojunction type may be formed by forming transparent electrode 12 and counter electrode 13 on both surfaces of photoelectric conversion layer 14.

Photoelectric conversion layer 14 is a layer which converts light energy into electric energy, and it is composed of a photoelectric conversion layer which is constituted by mixing a p-type semiconductor material and an n-type semiconductor material. A p-type semiconductor material functions relatively as an electron donor (donor), and an n-type semiconductor material functions relatively as an electron acceptor (acceptor).

Here, an electron donor and an electron acceptor are "an electron donor and an electron acceptor which form a pair of electron and positive hole (charge separation state) by transfer of an electron from an electron donor to an electron acceptor when a light is absorbed." That is, an electron is not donated or received like an electrode, but an electron is donated or received by a photoreaction.

In FIG. 1, the incident light entering to transparent electrode 12 through substrate 11 is absorbed by an electron donor or an electron acceptor in a photoelectric conversion layer of photoelectric conversion layer 14. An electron is transferred from the electron donor to the electron acceptor to form a pair of electron and positive hole (charge separation state). The generated electric charge is transported by an internal electric field, (for example, the electric potential difference of transparent electrode 12 and counter electrode 13 when the work function of the transparent electrode 12 and the counter electrode 13 are different). An electron passes through electron acceptors, while a positive hole passes through electron donors, and the electron and the positive hole each are respectively transported to a different electrode, and a photocurrent is detected.

For example, when the work function of transparent electrode 12 is larger than the work function of counter electrode 13, the electron is transported to the transparent electrode 12 and the positive hole is transported to the counter electrode 13. In addition, if the size of a work function is reversed, the electron and the positive hole will be transported to the reverse direction to that described above. Moreover, the transportation direction of an electron and a positive hole is also controllable by applying a potential between the transparent electrode 12 and the counter electrode 13.

In addition, although not described in FIG. 1, it may possible to have other layers, such as a positive hole block layer, an electron block layer, an electron injection layer, a positive hole injection layer, or a smoothing layer.

More preferable structure is a structure in which the above-mentioned photoelectric conversion layer 14 is composed of three layered structure of so-called p-i-n structure. The usual photoelectric conversion layer is a single 14i layer containing a p-type semiconductor material and an n-type semiconductor material mixed with each other. By sandwiching 14i layer with 14p layer composed of a p-type semiconductor material single substance and 14n layer composed of an n-type semiconductor material single substance, the rectifying property of a positive hole and an electron becomes higher, the loss caused by the recombination of a positive hole and an electron which carried out charge separation is reduced, and still higher photoelectric conversion efficiency can be acquired by this structure.

Figure 3:
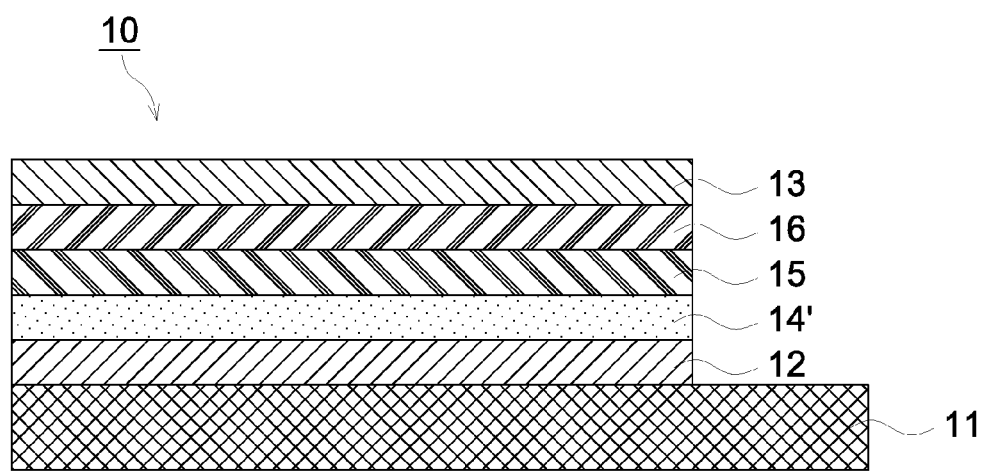
FIG. 3 is a cross-sectional view showing a solar cell having an organic photoelectric conversion element containing photoelectric conversion layers of a tandem type.

Furthermore, it is also possible to make a tandem type structure produced by laminating a plurality of the aforesaid photoelectric conversion elements for the purpose of improving a sunlight utilization factor (photoelectric conversion efficiency). FIG. 3 is a cross-sectional view showing a solar cell having an organic photoelectric conversion element containing photoelectric conversion layers of a tandem type.

A tandem type structure can be made as follows. After laminating transparent electrode 12 and first photoelectric conversion layer 14' successively on substrate 11, charge recombination layer 15 is laminated. Then, second photoelectric conversion layer 16 and counter electrode 13 are laminated to achieve a tandem type structure. The second photoelectric conversion layer 16 may be a layer which absorbs the same spectrum as an absorption spectrum of the first photoelectric conversion layer 14', or it may a layer which absorbs a different spectrum. Preferably, the second photoelectric conversion layer 16 absorbs a different spectrum from that of the first photoelectric conversion layer 14'. Moreover, both the first photoelectric conversion layer 14' and the second photoelectric conversion layer 16 may be three layered lamination structure of p-i-n as mentioned above.

Hereinafter, the materials which constitute these layers will be described.

[N-Type Semiconductor Material]

The organic photoelectric conversion element of the present invention is characterized in that in a bulk heterojunction layer formed by a mixture of an n-type semiconductor material and a p-type semiconductor material contains, there are used a polymer as an n-type semiconductor material and a low molecular weight material as a p-type semiconductor material.

In the present invention, a low molecular weight compound means a single molecule which does not have distribution in the molecular weight of a compound. On the other hand, a polymer means an assembled compound obtained by the reaction of a prescribed monomer and has a specific molecular weight distribution. However, when a compound is defined according to a molecular weight from a practical viewpoint, preferably, a compound having a molecular weight 5,000 or less will be classified as a low molecular weight compound. More preferably, it is 4,000 or less, and still more preferably, it is 3,000 or less (the molecular weight of fullerene is 720, and this value is less than an about tetramer). On the other hand, a compound having a molecular weight of 3,000 or more is classified as a polymer, more preferably, a compound having a molecular weight of 4,000 or more, and still more preferably, 5,000 or more are classified as a polymer. In addition, although a molecular weight can be measured with gel permeation chromatography (GPC), in the case of a polymer having a three-dimensional network structure which is mentioned later, it is difficult to specify a molecular weight correctly.

Generally, a p-type and an n-type indicate whether it is a positive hole or an electron which is contributed to electric conduction in a semiconductor material. An n-type semiconductor material is a material which mainly transports an electron.

Although the mixing ratio of these materials is arbitrary, p:n is preferably between 1:10 and 10:1. Basically, a p-type materials will absorb a light, therefore, it is preferable that the ratio of a p-type semiconductor material is high if circumstances allow, but hole mobility of an organic photoelectric conversion element and electron mobility are correlated with the mixing ratio of a p-type material and an n-type material. As a result, preferably, it is between 2:1 and 1:5, and more preferably it is between 5:4 and 1:2.

Examples of an n-type semiconductor material include: fullerene, octaazaporphyrin, a perfluoro compound of a p-type semiconductor (perfluoropentacene and perfluorophthalocyanine), a polymer compound which contains an aromatic carboxylic acid anhydride and its imide in the structure, such as naphthalenetetracarboxylic anhydride, naphthalenetetracarboxylic diimide, perylenetetracarboxylic anhydride, and perylenetetracarboxylic diimide.

Among them, a polymer containing a fullerene compound is preferable. Examples of a polymer containing a fullerene compound include a polymer having the following fullerene in the structure: fullerene $C_{60}$, fullerene $C_{70}$, fullerene $C_{76}$, fullerene $C_{78}$, fullerene $C_{84}$, fullerene $C_{240}$, fullerene $C_{540}$, mixed fullerene, fullerene nano-tube, multi layer nano-tube, mono layer nano-tube, and nano-horn (cone type). As a polymer containing a fullerene compound, it is preferable a polymer compound (derivative) having fullerene $C_{60}$ in the structure.

A polymer containing fullerene is roughly divided into the following: a polymer in which fullerene is bonded as a pendant to the polymer main chain; and a polymer in which fullerene is contained in the polymer main chain. It is preferable a polymer in which fullerene is contained in the polymer main chain. It is presumed that since a polymer having a pendant fullerene has a branched polymer structure, it is hard to achieve a high density packing when it is solidified, and as a result, it is difficult to obtain high mobility.

Specifically, a compound represented by the above-mentioned Formula (1) can be suitable used.

In Formula (1), $R_1$ and $R_2$ each represent a substituent selected from the group consisting of a substituted or unsubstituted alkyl group, cycloalkyl group, aralkyl group, aryl group, heteroaryl group and silyl group; $L_1$ and $L_2$ each represent a substituted or unsubstituted alkylene group, alkenediyl group, alkynediyl group, cycloalkylene group, arylene group, heteroarylene group, silylene group, ether group, thioether group, carbonyl group, carboxyl group, amino group, amide group, or a structure containing a plurality of the foregoing groups connected with each other; and n is an integer of 2 or more Examples of a substituted or unsubstituted alkyl group, cycloalkyl group, aralkyl group, aryl group, heteroaryl group and silyl group represented by $R_1$ and $R_2$ are as follows: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group and a pentadecyl group); a cycloalkyl group (for example, a cyclopentyl group and a cyclohexyl group); an aralkyl group (for example, a benzyl group and a 2-phenethyl group); an aryl group (for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group and a biphenylyl group); a heteroaryl group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group and a phthalazinyl group); and a silyl group (for example, a trimethyl silyl group, a thiethyl silyl group, a tert-butyldimethyl silyl group, a triisopropyl silyl group and a tert-butyldiphenyl silyl group).

Example of a substituent to these groups are: and alkyl group (for example, a methyl group, an ethyl group, a propyl group, an isopropyl group, a tert-butyl group, a pentyl group, a hexyl group, an octyl group, a dodecyl group, a tridecyl group, a tetradecyl group and a pentadecyl group); an alkyl halide group (for example, a trifluoromethyl group and a 1,1,1-trifluoropropyl group); an alkenyl group (for example, a vinyl group and an allyl group); an alkynyl group (for example, an ethynyl group and a propargyl group); a cycloalkyl group (for example, a cyclopentyl group and a cyclohexyl group); an aryl group (for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group and a biphenylyl group); an aryl halide group (for example, a pentafluorophenyl group and a pentachlorophenyl group); a heteroaryl group (for example, furyl group, thienyl group, a pyridyl group, a pyridazinyl group, a pyrimidinyl group, a pyrazinyl group, the triazinyl group, an imidazolyl group, a pyrazolyl group, a thiazolyl group, a quinazolinyl group and a phthalazinyl group); and an alkyl silyl group (for example, a trimethyl silyl group, a triethyl silyl group, (i or n) silyl group and a tributyl (i, t, or n) silyl group). These substituents may be further substituted by the above-mentioned substituent, and a plurality of substituents may be joined with each other to form a ring.

Example a substituted or unsubstituted alkylene group, alkenediyl group, alkynediyl group, cycloalkylene group, arylene group, heteroarylene group, silylene group, ether group, thioether group, carbonyl group, carboxyl group, amino group, amide group represented by $L_1$ and $L_2$ are as follows: an alkylene group of 1 to 22 carbon atoms, an alkene-1,2-diyl group, an alkyne-1,2-diyl group, a cycloalkylene group and a structure connected a plurality of these groups, as an arylene group, a phenylene group and a naphthylene group are cited, and preferable is a phenylene group. As a heteroarylene group, there are cited: a furylene group, a thienylene group, a pyridynylene group, a pyridazinylene group, a pyrimidinylene group, a pyrazinylene group, a triazinylene group, an imidazolynylene group, a pyrazolylylene group, a thiazolylylene group, a quinazolylylene group and a phthalazinylene group. As a silylene group, there are cited a dimethyl silylene group and a diphenyl silylene group.

It is more preferable that the n-type semiconductor further forms a network structure having cross-linking in three dimensions, i.e., having a three-dimensional network structure. By forming such three-dimensional network structure, a high rigid n-type carrier path structure can be formed. It can prevent the time-dependent change of the phase separation structure of a p-type layer and an n-type layer, and as a result, it can be obtained an organic photoelectric conversion element exhibiting high durability. As a secondary effect, when there are formed a positive hole transport layer, an electron transport layer, a positive hole block layer and an electron block layer, etc on a bulk heterojunction layer in a solution process, it will prevent dissolution of a bulk heterojunction layer. As a result, the materials which constitute the forgoing layers will not be mixed with the material which constitutes bulk heterojunction layer, and further improved efficiency and increased lifetime can be attained.

Among fullerene containing monomers which are capable of forming such three-dimensional network structure as described above, preferable is a compound represented by Formula (2).

In Formula (2), $R_3$ and $R_4$, like the aforesaid $R_1$ and $R_2$, each represent a substituent selected from the group consisting of a substituted or unsubstituted alkyl group, cycloalkyl group, aralkyl group, aryl group, heteroaryl group and silyl group, like the aforesaid $R_1$ and $R_2$.

$L_3$ and $L_4$, like the aforesaid $L_1$ and $L_2$, each represent a substituted or unsubstituted alkylene group, alkenediyl group, alkynediyl group, cycloalkylene group, arylene group, heteroarylene group, silylene group, ether group, thioether group, carbonyl group, carboxyl group, amino group, amide group, or a structure containing a plurality of the said groups connected with each other.

$G_1$ and $G_2$ each represent a polymerizable group which forms a linking chain of a three-dimensional network structure, provided that Formula shows one hemispherical portion among a spherical fullerene structure and the other hemispherical portion is omitted, and a spatial relationship of a first substituent containing $G_1$, $R_3$ and $L_3$ to a second substituent containing $G_2$, $R_4$ and $L_4$ in the fullerene structure is arbitrary.

The following compounds can be cited as an example of such a compound.

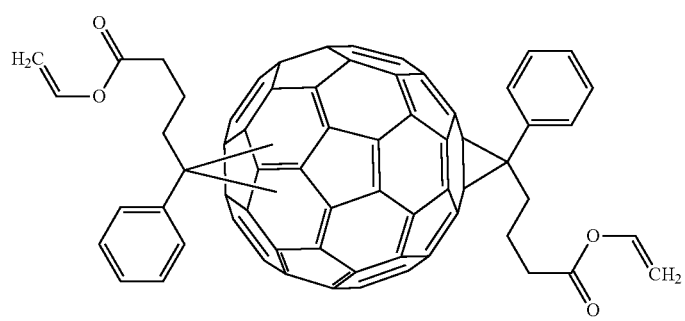

1

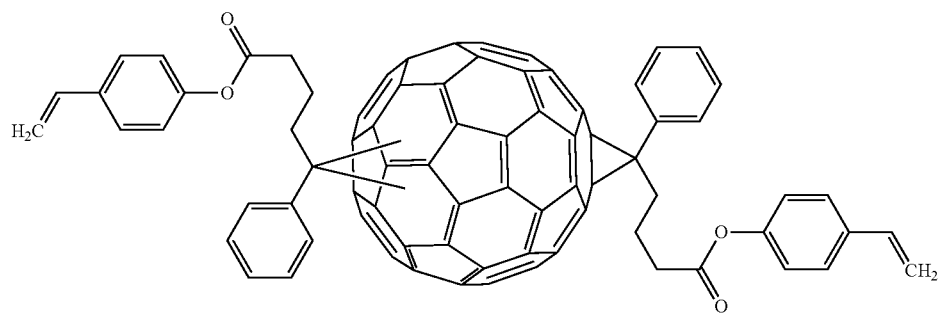

2

-continued
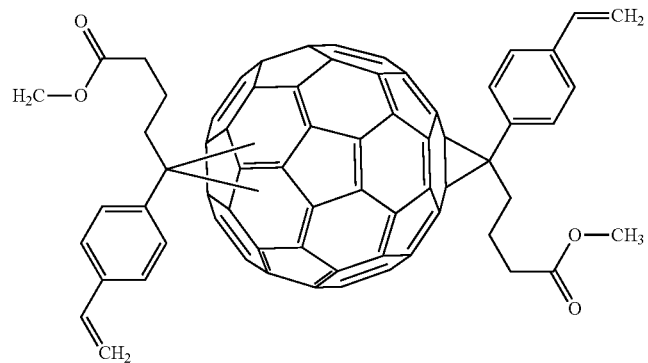
3
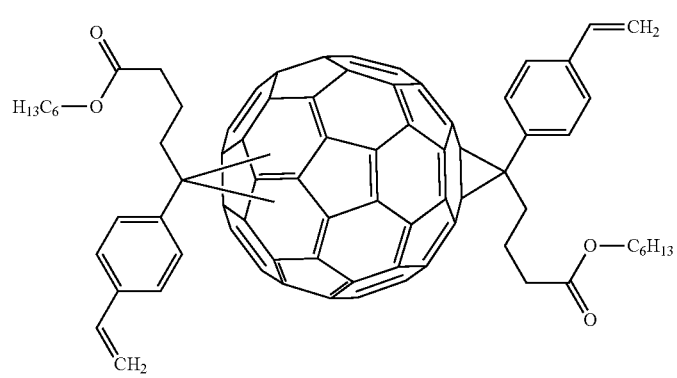
4
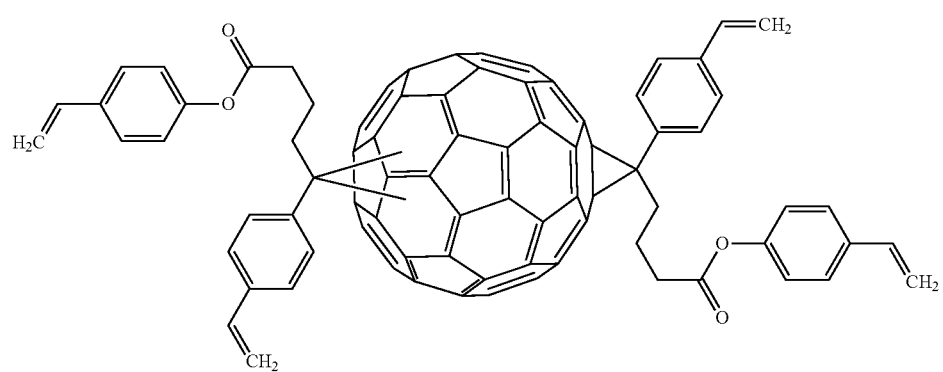
5
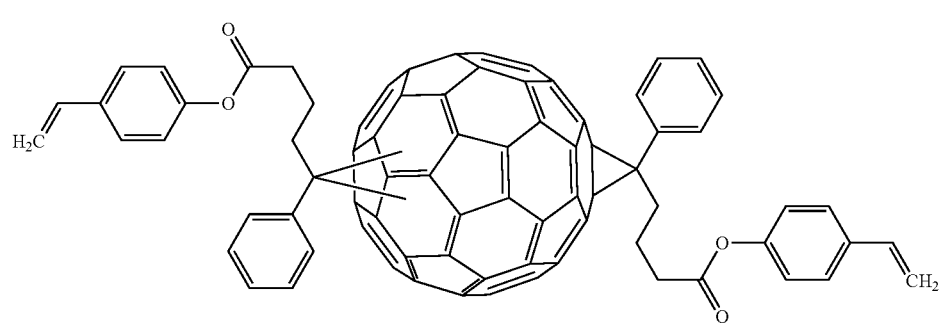
6

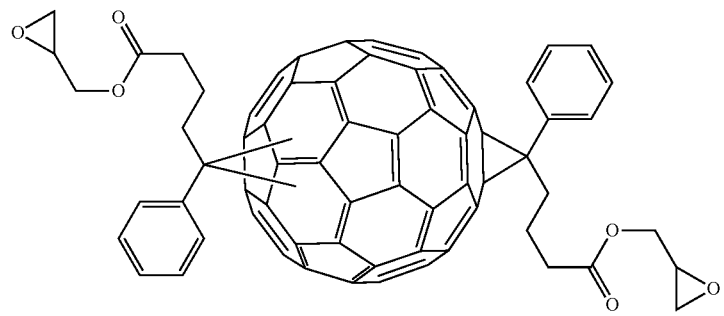

7

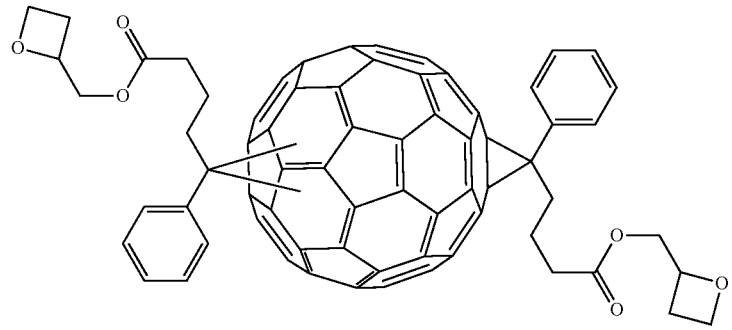

8

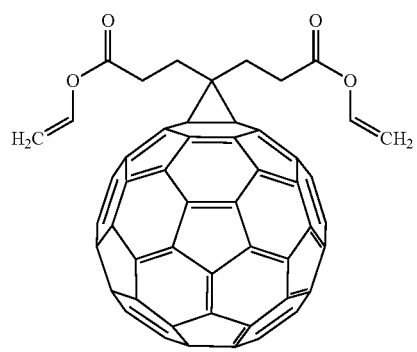

9

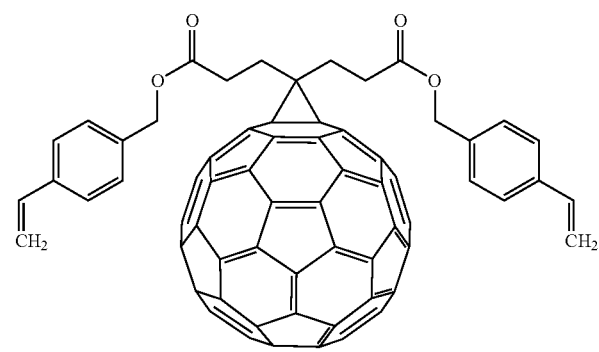

10

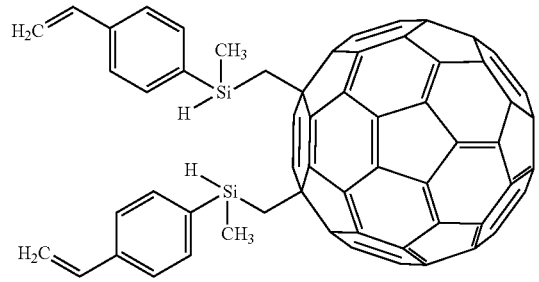

11

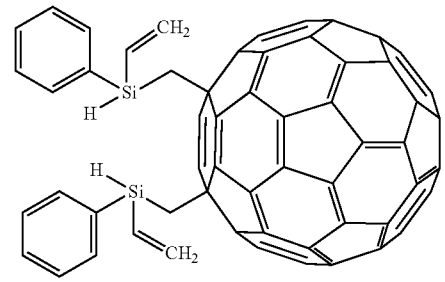

12

These compounds can be synthesized by referring to, for example, the references of J. Mater. Chem., vol. 15 (2005), p. 5158; Adv. Mater., vol. 20 (2008), p. 2116; and Angewandte Chemie, International Edition, vol. 41 (2002), p. 838.

Among these compounds, preferable are compounds having a vinyl group as a polymerizable group ($G_1$ and $G_2$ in the above-described Formula (2)) which will not produce a functional group serving as a carrier trap after cross-linking polymerization.

In addition, the polymer compound which founts these three-dimensional networks is non-soluble in a solvent. Therefore, after forming a bulk heterojunction layer in a monomer state, a cross-linking polymerization reaction is carried out by various methods of exposing to heat, light, radiation, or a vapor of a compound which triggers a polymerization initiation reaction. Moreover, it may possible to mix beforehand a polymerization initiator which triggers a polymerization initiation reaction by heat, lights, or radiation. Among these methods, it is preferable to carry out cross-linking polymerization reaction by heat or light, and especially, a compound which is able to be cross-linking polymerized without using a polymerization initiator is preferably used.

[P-Type Semiconductor Material Precursor]

The organic photoelectric conversion element of the present invention is characterized in that, in a bulk heterojunction layer formed by mixing an n-type semiconductor material and a p-type semiconductor material, there are used a polymer as an n-type semiconductor material and a low molecular weight material as a p-type semiconductor material.

As a p-type semiconductor material used for the present invention, various types of condensed polycyclic aromatic compounds and conjugated system compounds are cited.

Examples of a condensed polycyclic aromatic compound include: anthracene, tetracene, pentacene, hexacene, heptacene, chrysene, picene, fulminene, pyrene, peropyrene, perylene, terylene, quoterylene, coronene, ovalene, circumanthracene, bisanthene, zethrene, heptazethrene, pyanthrene, violanthene, isoviolanthene, circobiphenyl, anthradithiophene and a derivative of a precursor thereof.

Examples of a conjugated system compound include: polythiophene and its oligomer, polypyrrole and its oligomer, poly aniline, polyphenylene and its oligomer, polyphenylene vinylene and its oligomer, poly thienylene vinylene and its oligomer, polyacethylene, polydiacetylene, a tetrathiafulvalene compound, a quinone compound, a cyano compound such as a tetracyanoquinodimethane, fullerene, a derivative thereof and a mixture thereof.

Among polythiophene and its oligomer, suitably used oligomers are thiophene hexamers such as: α-sexithionene, α,ω-dibexyl-α-sexithionene, α,ωdihexyl-α-quinquethionene, and α,ω-bis(3-butoxypropyl)-α-sexithionene.

Further, there can be used the following compounds: porphyrin, copper phthalocyanine; organic molecule complex such as tetrathiafulvalene (TTF)-tetracyanoquinodimethane (TCNQ) complex, bisethylenetetrathiafulvalene (BEDTTTF)-perchloric acid complex, BEDTTTF-Iodine complex, TCNQ-Iodine complex; fullerenes such as fullerene $C_{60}$, fullerene $C_{70}$, fullerene $C_{76}$, fullerene $C_{78}$, and fullerene $C_{84}$; carbon nanotube such as SWNT; dyes such as merocyanine dye and hemicyanine dye; σ conjugated polymers such as polysilane and polygerman, and organic-inorganic mixed materials disclosed in JP-A No. 2000-260999.

Among these π conjugated materials, preferable is a compound selected from the group consisting of condensed polycyclic aromatic compounds such as pentacene, fullerene compounds, condensed cyclic tetracaroboxylic acid diimide compounds, metal phthalocyanine compounds and metal porphiline compounds. Here, pentacene is more preferable Examples of a pentacene compound are: pentacene compounds having a substituent disclosed in WO 03/16599, WO 03/28125, U.S. Pat. No. 6,690,029, and JP-A No. 2004-107216; pentacene precursors disclosed in US 2003/136964; substituted acenes and their derivatives disclosed in J. Amer. Chem. Soc., vol. 127. No. 14, 4986.

Among these compounds, preferable is a compound having a sufficiently high solubility to an organic solvent to be able to carry out a solution process, after dying, capable of forming a crystalline thin film and capable of achieving high mobility. Examples of such compounds are: acene compounds substituted with a trialkyl silyl ethynyl described in J. Amer. Chem. Soc., vol. 123, p 9482 and J. Amer. Chem. Soc., vol. 130 (2008), No. 9, 2706; pentacene precursors disclosed in US 2003/136964; precursor type compounds (precursors) such as porphiline precursors disclosed in JP-A No. 2007-224019. Among these, the latter precursor type compounds can be preferably used. Precursor type compound becomes insoluble after being converted. As a result, when there are formed a positive hole transport layer, an electron transport layer, a positive hole block layer and an electron block layer, etc on a bulk heterojunction layer in a solution process, it will prevent dissolution of a bulk heterojunction layer. As a result, the materials which constitute the forgoing layers will not be mixed with the material which constitutes bulk heterojunction layer, and further improved efficiency and increased lifetime can be attained.

As a p-type semiconductor material used for the organic photoelectric conversion element of the present invention, it is preferable to use a p-type semiconductor precursor which is converted to a p-type semiconductor material induced by a chemical structure change when exposed to heat, light, radiation or a vapor of a compound which triggers a chemical reaction. In particular, a compound which causes change in chemical structural with heat is preferable.

The bulk heterojunction layer is preferably a layer formed by using a solution dissolving a p-type semiconductor material precursor and an n-type semiconductor material. Moreover, the bulk heterojunction layer is preferably a layer formed by heating the aforesaid layer.

The p-type semiconductor material precursor is converted to a p-type semiconductor material by thermal treatment. It is a compound which changes its chemical structure before and after the aforesaid thermal treatment to result in changing the solubility to the solvent which is used for forming the composition layer of an organic photoelectric conversion element by coating (solution coating). Specifically, the p-type semiconductor material precursor which is soluble in a solvent will be changed into insoluble by thermal treatment.

From the viewpoint of adjusting the solubility to the solvent used for coating the composition layer of an organic photoelectric conversion element before and after thermal treatment, it is preferable that the molecular weight A of the p-type semiconductor material precursor in the layer containing the p-type semiconductor material precursor and the molecular weight B of the p-type semiconductor material formed by the conversion process of the aforesaid precursor satisfy the following Inequality (1).

Molecular weight A>Molecular weight B         Inequality (1):

Here, the above-mentioned Inequality (1) indicates that the following. The preferable embodiment is a change of the molecular weight A of the precursor by the change of the partial structure of the precursor, for example, elimination of a substituent, or cleavage of a chemical bond, when a chemical structure changes from a p-type semiconductor material precursor to a p-type semiconductor material.

Moreover, when elimination of a substituent, or cleavage of a chemical bond occurs, it is preferable that neither the eliminated substituent nor the molecule produced by to the cleavage of the chemical bond has effect which is undesirable on the properties of the p-type semiconductor material and the organic photoelectric conversion element Furthermore, it is preferable that the produced materials are easily and promptly eliminated from the system of the organic photoelectric conversion element.

As the above-described material, there can be cited precursor type materials (precursors) such as: a pentacene precursor described in JP-A No. 2003-136964; a phthalocyanine precursor described in JP-A No. 2007-224019; and a porphyrin precursor described in JP-A No. 2007-224019 and JP-A No. 2008-16834.

Among them, especially a tetrabenzoporphyrin derivative is preferably used since its precursor has high solubility, and the mobility of the produced p-type semiconductor material after conversion is high.

Although the following compounds are cited as examples of a tetrabenzoporphyrin derivative, the present invention is not limited to them.
(BP-1)
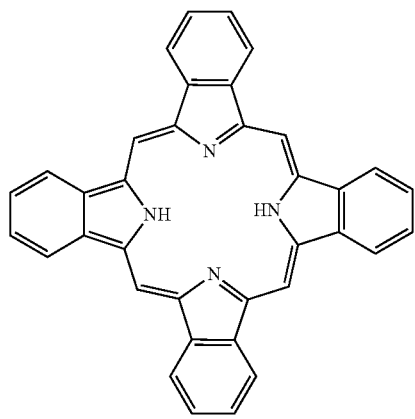
(BP-2)
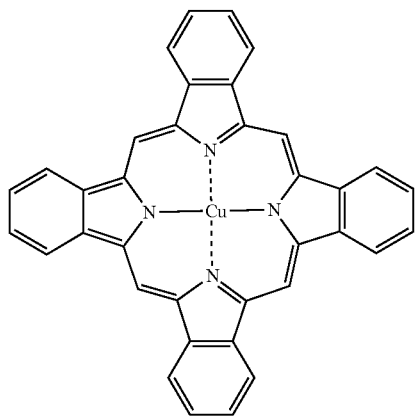
(BP-3)
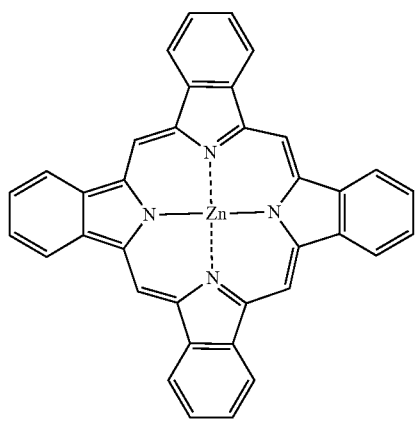
-continued
(BP-4)
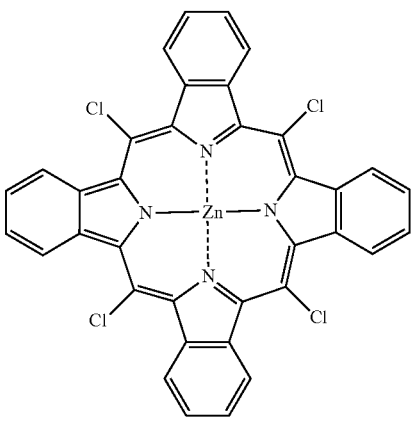
(BP-5)
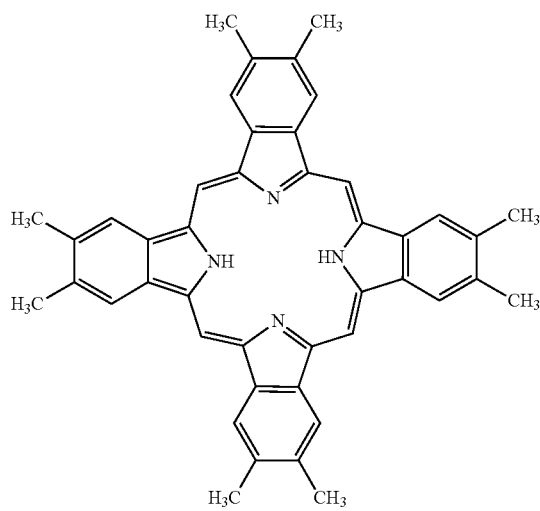
(BP-6)
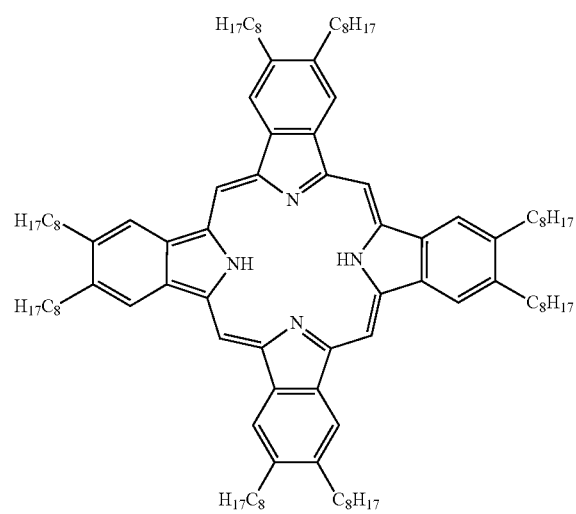

(BP-7)
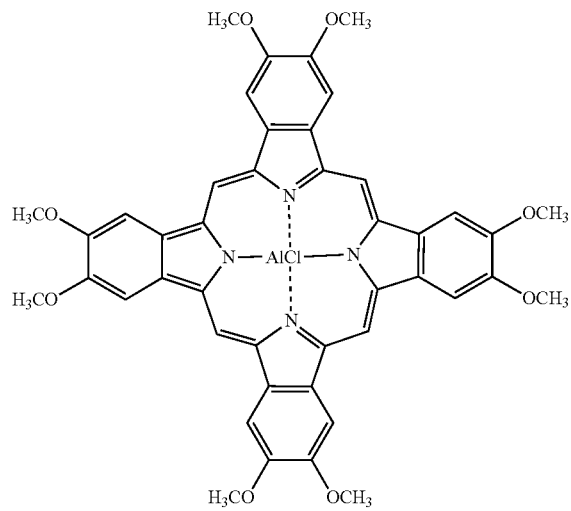
(BP-8)
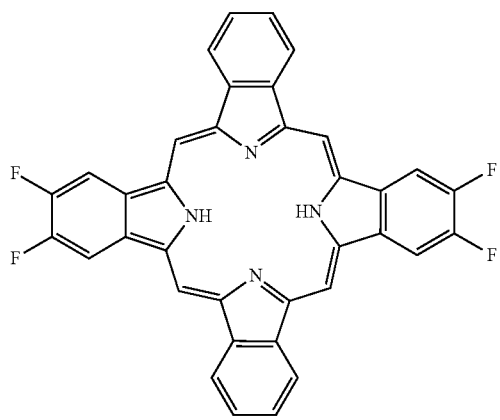
(BP-9)
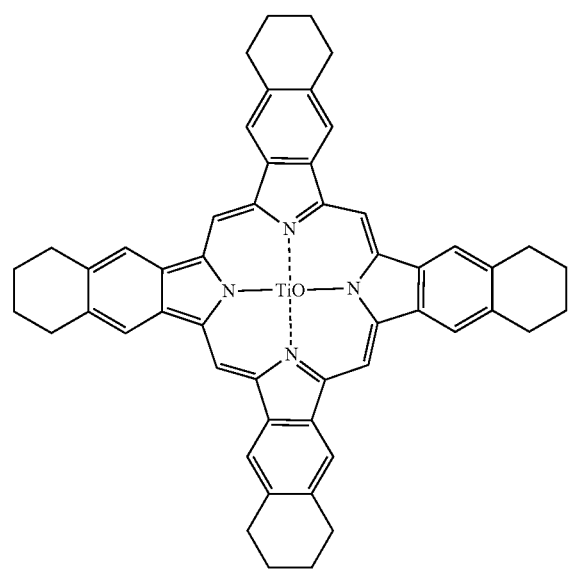
(BP-10)
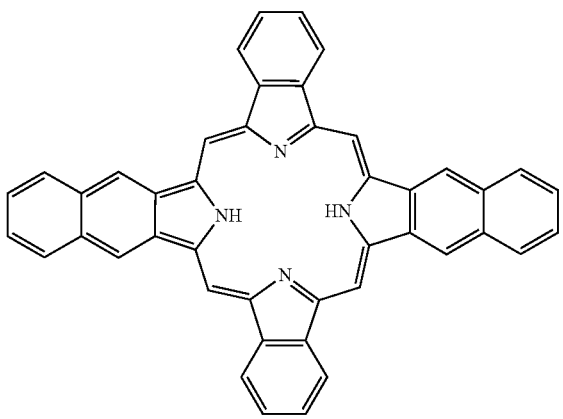
(BP-11)
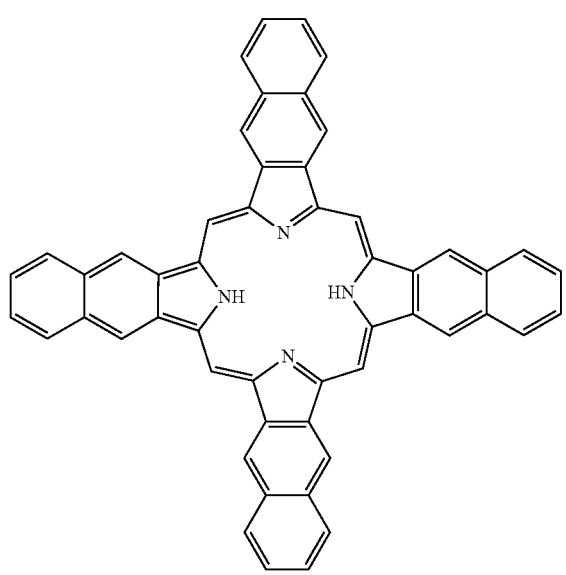
(BP-12)
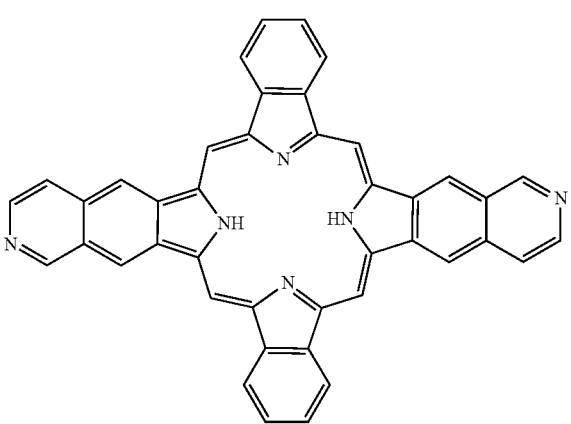

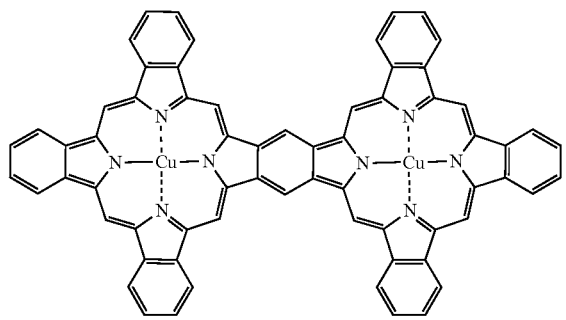
(BP-13)

Although compounds represented by the following Formulas (3) and (4) are cited as examples of a tetrabenzoporphyrin derivative precursor, the present invention is not limited to them

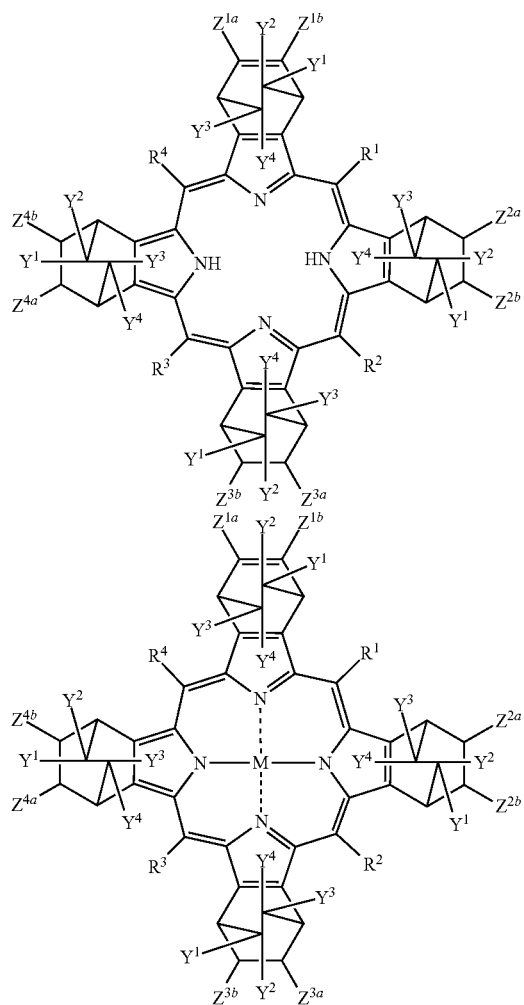

In Formulas (3) and (4), $Z^{ia}$ and $Z^{ib}$ ("i" represents an integer of 1 to 4) each independently represents a monovalent atom or atomic group, provided that $Z^{ia}$ and $Z^{ib}$ may joined to form a ring; $R^1$ to $R^4$ each independently represents a monovalent atom or atomic group; $Y^1$ to $Y^4$ each independently represents a monovalent atom or atomic group; and M represents a divalent metal atom or an atomic group formed by a trivalent or more metal atom bonded with other atom.

In Formulas (3) and (4), $Z^{ia}$ and $Z^{ib}$ ("i" represents an integer of 1 to 4) each independently represents a monovalent atom or atomic group. Examples of an atom represented by $Z^{ia}$ and $Z^{ib}$ are: a hydrogen atom; and a halogen atom such as a fluorine atom, a chlorine atom, a bromine atom and an iodine atom.

Examples of an atomic group represented by $Z^{ia}$ and $Z^{ib}$ are: a hydroxyl group; an amino group; an organic group (for example, an alkyl group, an aralkyl group, a alkenyl group, a cyano group, an acyl group, an alkoxy group, an alkoxy carbonyl group, an aryloxy group, a dialkylamino group, a diaralkylamino group, a haloalkyl group, an aromatic hydrocarbon ring group and an aromatic heterocyclic group)

Among the aforesaid organic groups, although the carbon atom number of the alkyl group is arbitrary as long as it does not remarkably deteriorate the effects of the present invention, usually, it is 12 or less, more preferably it is 8 or less. When the carbon atom number of the alkyl group is too large, the semiconductor property may be lowered, or the solubility may be increased, and it may be dissolved again at the time of laminating the layers, or heat stability may be decreased. A methyl group and an ethyl group are cited as examples of this alkyl group.

Among the aforesaid organic groups, although the carbon atom number of the aralkyl group is arbitrary as long as it does not remarkably deteriorate the effects of the present invention, usually, it is 12 or less, more preferably it is 8 or less. When the carbon atom number of the aralkyl group is too large, the semiconductor property may be lowered, or the solubility may be increased, and it may be dissolved again at the time of laminating the layers, or heat stability may be decreased. A benzyl group is cited as an example of this aralkyl group.

Among the aforesaid organic groups, although the carbon atom number of the alkenyl group is arbitrary as long as it does not remarkably deteriorate the effects of the present invention, usually, it is 12 or less, more preferably it is 8 or less. When the carbon atom number of the alkenyl group is too large, the semiconductor property may be lowered, or the solubility may be increased, and it may be dissolved again at the time of laminating the layers, or heat stability may be decreased. A vinyl group is cited as an example of this alkenyl group.

Among the aforesaid organic groups, although the carbon atom number of the acyl group is arbitrary as long as it does not remarkably deteriorate the effects of the present invention, usually, it is 12 or less, more preferably it is 8 or less. When the carbon atom number of the acyl group is too large, the semiconductor property may be lowered, or the solubility may be increased, and it may be dissolved again at the time of laminating the layers, or heat stability may be decreased. A formyl group, and an acetyl group and a benzoyl group are cited as examples of this acyl group.

Among the aforesaid organic groups, although the carbon atom number of the alkoxy group is arbitrary as long as it does not remarkably deteriorate the effects of the present invention, usually, it is 12 or less, more preferably it is 8 or less. When the carbon atom number of the alkoxy group is too large, the semiconductor property may be lowered, or the solubility may be increased, and it may be dissolved again at the time of laminating the layers, or heat stability may be decreased. A methoxy group and an ethoxy group are cited as examples of this alkoxy group.

Among the aforesaid organic groups, although the carbon atom number of the alkoxycarbonyl group is arbitrary as long as it does not remarkably deteriorate the effects of the present invention, usually, it is 12 or less, more preferably it is 8 or less. When the carbon atom number of the alkoxycarbonyl group is too large, the semiconductor property may be lowered, or the solubility may be increased, and it may be dissolved again at the time of laminating the layers, or heat stability may be decreased. A methoxycarbonyl group and an ethoxycarbonyl group are cited as examples of this alkoxycarbonyl group.

Among the aforesaid organic groups, although the carbon atom number of the aryloxy group is arbitrary as long as it does not remarkably deteriorate the effects of the present invention, usually, it is 12 or less, more preferably it is 8 or less. When the carbon atom number of the aryloxy group is too large, the semiconductor property may be lowered, or the solubility may be increased, and it may be dissolved again at the time of laminating the layers, or heat stability may be decreased. A phenoxy group and a benzyloxy group are cited as examples of this aryloxy group.

Among the aforesaid organic groups, although the carbon atom number of the dialkylamino group is arbitrary as long as it does not remarkably deteriorate the effects of the present invention, usually, it is 12 or less, more preferably it is 8 or less. When the carbon atom number of the dialkylamino group is too large, the semiconductor property may be lowered, or the solubility may be increased, and it may be dissolved again at the time of laminating the layers, or heat stability may be decreased. A diethylamino group and a diisopropylamino group are cited as examples of this dialkylamino group.

Among the aforesaid organic groups, although the carbon atom number of the diaralkylamino group is arbitrary as long as it does not remarkably deteriorate the effects of the present invention, usually, it is 12 or less, more preferably it is 8 or less. When the carbon atom number of the diaralkylamino group is too large, the semiconductor property may be lowered, or the solubility may be increased, and it may be dissolved again at the time of laminating the layers, or heat stability may be decreased. A dibenzylamino group and a diphenethylamino group are cited as examples of this diaralkylamino group.

Among the aforesaid organic groups, although the carbon atom number of the haloalkyl group is arbitrary as long as it does not remarkably deteriorate the effects of the present invention, usually, it is 12 or less, more preferably it is 8 or less. When the carbon atom number of the haloalkyl group is too large, the semiconductor property may be lowered, or the solubility may be increased, and it may be dissolved again at the time of laminating the layers, or heat stability may be decreased. An α-haloalkyl group such as a trifluoromethyl group is cited as an example of this haloalkyl group.

Among the aforesaid organic groups, although the carbon atom number of the aromatic hydrocarbon ring group is arbitrary as long as it does not remarkably deteriorate the effects of the present invention, usually, it is 6 or more, more preferably it is 10 or more; or usually, it is 30 or less, more preferably it is 20 or less. When the carbon atom number of the aromatic hydrocarbon ring group is too large, the semiconductor property may be lowered, or the solubility may be increased, and it may be dissolved again at the time of laminating the layers, or heat stability may be decreased. A phenyl group and a naphthyl group are cited as examples of this aromatic hydrocarbon ring group.

Among the aforesaid organic groups, although the carbon atom number of the aromatic heterocyclic group is arbitrary as long as it does not remarkably deteriorate the effects of the present invention, usually, it is 2 or more, more preferably it is 5 or more; or usually, it is 30 or less, more preferably it is 20 or less. When the carbon atom number of the aromatic heterocyclic group is too large, the semiconductor property may be lowered, or the solubility may be increased, and it may be dissolved again at the time of laminating the layers, or heat stability may be decreased. A thienyl group and a pyridyl group are cited as examples of this aromatic heterocyclic group.

Further, the above-described atomic groups may have an arbitrary substituent as long as it does not remarkably deteriorate the effects of the present invention. Examples of the aforesaid substituent include: a halogen atom such as a fluorine atom; an alkyl group of 1 to 6 carbon atoms such as a methyl group and an ethyl group; an alkenyl group such as a vinyl group; an alkoxycarbonyl group of 1 to 6 carbon atoms such as a methoxycarbonyl group and an ethoxylcarbonyl group; an aryloxy group such as a phenoxy group and a benzyloxy group; a dialkylamino group such as a dimethylamino group and a diethylamino group; an acyl group such as an acetyl group; a haloalkyl groups such as a trifluoromethyl group; and a cyano group. In addition, these substituents each may be substituted solely, or may be substituted with plurality thereof. And two or more sorts may be substituted with an arbitrary combination and ratio.

In addition, $Z^{ia}$ and $Z^{ib}$ may be joined with each other to form a ring. When $Z^{ia}$ and $Z^{ib}$ form a ring, examples of a ring containing $Z^{ia}$ and $Z^{ib}$ include: an aromatic hydrocarbon ring such as a benzene ring, a naphthalene ring, and an anthracene ring, which may have a substituent; and an aromatic heterocycle such as a pyridine ring, a quinoline ring, a furan ring and a thiophene ring, which may have a substituent.

The aforesaid substituent which may have a ring formed by binding $Z^{ia}$ and $Z^{ib}$ is arbitrary as long as it does not remarkably deteriorate the effects of the present invention. Examples of such substituent are cited the same substituents which are already cited for the atomic groups composing $Z^{ia}$ and $Z^{ib}$. In addition, these substituents each may be substituted solely, or may be substituted with plurality thereof. And two or more sorts may be substituted with an arbitrary combination and ratio.

Among the aforesaid $Z^{ia}$ and $Z^{ib}$, a hydrogen atom is particularly preferable, since packing of the produced crystal will be satisfactory and excellent semiconductor properties will be obtained.

In Formulas (3) and (4), $R^1$ to $R^4$ each independently represents a monovalent atom or atomic group.

Examples of $R^1$ to $R^4$ are cited the same groups cited for $Z^{ia}$ and $Z^{ib}$ described above. When $R^1$ to $R^4$ are an atomic group, the atomic group may have an arbitrary substituent as long as it does not remarkably deteriorate the effects of the present invention. Examples of the substituent are cited the same substituents cited for $Z^{ia}$ and $Z^{ib}$ described above. In addition, these substituents each may be substituted solely, or may be substituted with plurality thereof. And two or more sorts may be substituted with an arbitrary combination and ratio. Provided that in order to increase a planarity of the molecule $R^1$ to $R^4$ are preferably selected from a hydrogen atom and a halogen atom.

In Formula (4), M represents a divalent metal atom or an atomic group formed by a trivalent or more metal atom bonded with other atom. When M is a divalent metal atom, examples thereof include: Zn, Cu, Fe, Ni and Co. On the other hand, when M is an atomic group formed by a trivalent or more metal atom bonded with other atom, examples thereof include: Fe—$B^1$, Al—$B^2$, Ti=O, Si—$B^3B^4$. Here, $B^1$, $B^2$, $B^3$ and $B^4$ each represents a monovalent group such as: a halogen atom, an alkyl group and an alkoxy group.

In Formulas (3) and (4), $Y^1$ to $Y^4$ each independently represents a monovalent atom or atomic group. Further, in Formulas (3) and (4), there are four $Y^1$ to $Y^4$ in each Formula, and $Y^1$s, $Y^2$s, $Y^3$s and $Y^4$s each may be respectively the same or different with each other.

As an example of an atom for $Y^1$ to $Y^4$, a hydrogen atom can be cited.

On the other hand, as an atomic group, there can be cited a hydroxyl group and an alkyl group. Although the carbon atom number of the alkyl group is arbitrary as long as it does not remarkably deteriorate the effects of the present invention, usually, it is 10 or less, more preferably it is 6 or less, and still more preferably it is 3 or less. When the carbon atom number of the alkyl group is too large, the leaving group will become too large. As a result, the leaving group becomes difficult to volatilize and it may remain in the film. Examples of the alkyl group include: a methyl group and an ethyl group.

When $Y^1$ to $Y^4$ each represents an atomic group, the atomic group may have an arbitrary substituent as long as it does not remarkably deteriorate the effects of the present invention. Examples of the substituent are cited the same substituents cited for $Z^{ia}$ and $Z^{ib}$ described above. In addition, these substituents each may be substituted solely, or may be substituted with plurality thereof. And two or more sorts may be substituted with an arbitrary combination and ratio.

Among the aforesaid $Y^1$ to $Y^4$, preferable is a hydrogen atom, or an alkyl group having 10 carbon atoms or less. Further, among them, it is specifically preferable that: all of $Y^1$ to $Y^4$ are a hydrogen atom; or at least in one of pairs of ($Y^1$, $Y^2$) and ($Y^3$, $Y^4$), both components in each pair are an alkyl group having 10 carbon atoms or less. It is because, the solubility becomes large and its film forming property becomes improved.

The precursor concerning the present invention is changed into a benzoporphyrin derivative of the present invention by being subjected to thermal treatment. Although there is no restriction about what kind of reaction takes place when thermal treating is given, in the case of a precursor represented by the above-mentioned Formulas (3) and (4), for example, a compound represented by the Formula (5) will be eliminated by applying heat. This elimination reaction advances quantitatively. And the precursor concerning the present invention is changed into a benzoporphyrin derivative of the present invention by this elimination reaction.

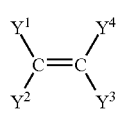

Formula (5)

The thermal treatment will be described by referring to benzoporphyrin derivative BP-1 illustrated above as an example. As a precursor of a benzoporphyrin derivative BP-1, it ca be used a compound represented by Formulas (3) or (4) in which all of $Z^{ia}$, $Z^{ib}$, $R^1$ to $R^4$, and $Y^1$ to $Y^4$ are a hydrogen atom (henceforth, it is called as "BP-1 precursor"). However, the precursor of benzoporphyrin derivative BP-1 is not limited to this BP-1 precursor.

When the BP-1 precursor is heated, an ethylene group is eliminated from each of four rings bonded to the porphyrin ring. Benzoporphyrin derivative BP-1 is obtained by this ethylene elimination reaction. This conversion is represented by the following reaction scheme.

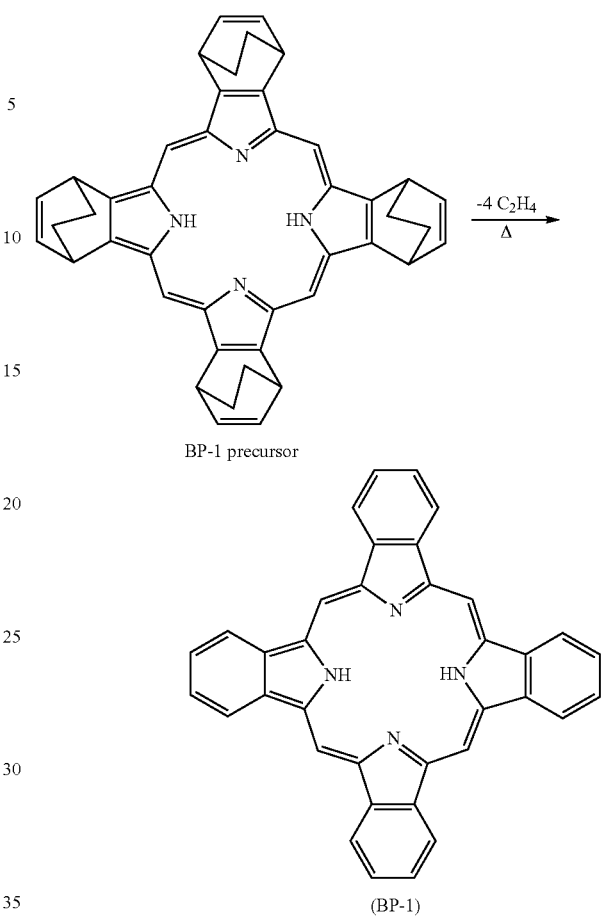

When the precursor concerning the present invention is converted to the benzoporphyrin derivative of the present invention by the thermal treatment, the temperature condition is not limited as long as the above-described reaction proceeds, but usually it is 100° C. or more, and preferably it is 150° C. or more. If the temperature is too low, it takes time to complete the conversion and it may become practically undesirable. Although the upper limit is arbitrary, usually it is 400° C. or less, and preferably it is 300° C. or less. It is because there is a practicability of decomposition when temperature is too high. It is because there is a possibility that decomposition will occur when the temperature is too high.

When the precursor concerning the present invention is converted to the benzoporphyrin derivative of the present invention by the thermal treatment, the heating time is not limited as long as the above-described reaction proceeds, but usually it is 10 seconds or more, and preferably it is 30 seconds or more; and usually it is 10 hors or less, and preferably it is one hour or less. It is because there is a possibility of resulting in insufficient conversion when the heating time is too short, and there is a possibility of decomposition when the heating time is too long.

When the precursor concerning the present invention is converted to the benzoporphyrin derivative of the present invention by the thermal treatment, the atmosphere of the reaction is not limited as long as the above-described reaction proceeds, but it is preferable that it is an inert atmosphere. In this case, as a type of inert gas which can be used, a nitrogen gas and a rare gas are cited, for example. Herein., only one sort may be used for an inert gas and it may be used two or more sorts together with an arbitrary combination and ratio.

The precursor concerning the present invention has a high solubility to a solvent such as an organic solvent. Although a specific degree of solubility will depend on the type of solvent, for example, as a solubility to chloroform at 25° C., generally it is 0.1 g/L or more, preferably it is 0.5 g/L or more, and more preferably it is 1 g/L or more. In addition, although there is no restriction in the upper limit of solubility, it is usually 1,000 g/L or less.

The precursor concerning the present invention has a high solubility to a solvent, on the contrary, the benzoporphyrin of the present invention derivative derived from the precursor has a very low solubility to a solvent such as an organic solvent. This is supposed to be attributed to the following reasons. Since the structure of the precursor concerning the present invention is not planar structure, as a result, its solubility is high and it is hard to be crystallized. On the other hand, the benzoporphyrin derivative of the present invention has a planar structure. Therefore, by making use of this soluble difference to a solvent, it can be easily formed a layer containing the benzoporphyrin derivative by a coating method. For example, it can be produced by the following method. That is, the precursor concerning the present invention is dissolved in a solvent to prepare a solution. The prepared solution concerned is coated to make a good layer of near amorphous or amorphous. And this layer is subjected to a thermal treatment resulting in obtaining a layer of a benzoporphyrin derivative having high flatness by thermal conversion of the precursor of the present invention. Among the aforesaid compounds represented by Formulas (3) and (4), when a compound in which all of $Y^1$ to $Y^4$ are a hydrogen atom is used as a precursor, since the group eliminated is an ethylene molecule, it is hard to remain in a system and it is suitable from the viewpoints of toxicity and safety.

There is no restriction in the production method of the precursor concerning the present invention, and a well-known method can be adopted arbitrarily. For example, if the BP-1 above-mentioned precursor is mentioned as an example, it can be prepared through the following synthetic pathway. Here, "Et" indicates an ethyl group and "t-Bu" indicates a t-butyl group.

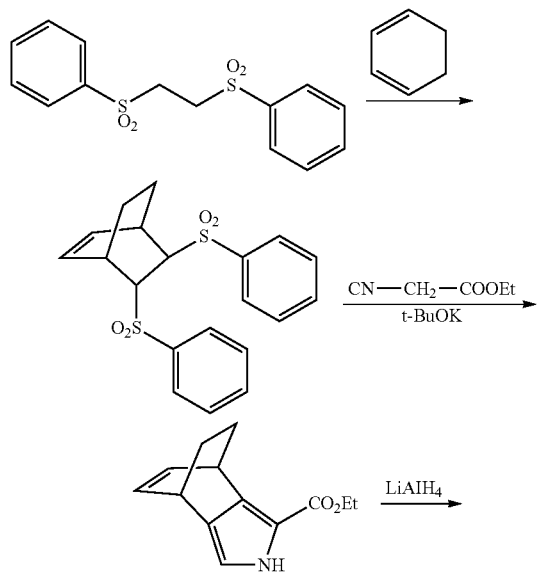

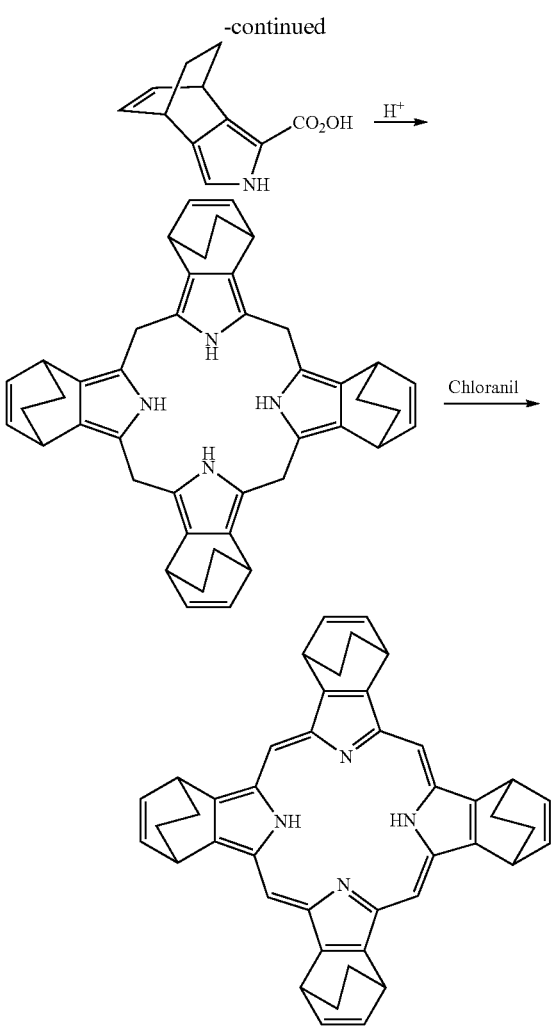

Furthermore, the tetrabenzoporphyrin derivative concerning the present invention may be, for example: the one in which two porphyrin rings share one atom and is carrying out coordination; the one in which two porphyrin rings shared one or more atoms or atomic groups, and combined; or the one in which three or more three or more porphyrin rings are joined together to form a long chain.

When the n-type semiconductor which forms the above-mentioned three-dimensional network structure is used, both of the p-type semiconductor material and the n-type semiconductor material which form a bulk heterojunction layer become very high in solvent resistivity to a solvent. As a result, when a positive hole transporting layer, an electron transport layer, an electron hole block layer and an electron block layer are formed on the bulk heterojunction layer by a solution process, the bulk heterojunction layer will be hardly dissolved. Furthermore, conversion of the p-type semiconductor material and the n-type semiconductor material can be simultaneously achieved when the cross-linking polymerization reaction of the above-mentioned n-type semiconductor layer occurs with heat. It is desirable.

[Electron Transport Layer and Positive Hole Block Layer]

The organic photoelectric conversion element of the present invention is preferably provided with an electron transport layer formed between a photoelectric conversion layer and a cathode. This enable to take out more efficiently the electric charge generated in the photoelectric conversion layer.

As an electron transport layer, there can be used: octaazaporphyrin and perfluoro derivative of a p-type semiconductor (for example, perfluoro pentacene and perfluoro phthalocyanine). To the electron transport layer which has a HOMO level deeper than the HOMO level of the p-type semiconductor material used for a photoelectric conversion layer, there is provided, at the same time, a positive hole block function having an rectifying effect by which the positive hole generated in the photoelectric conversion layer is not passed to the cathode side. It is more preferable to use a material having a deeper HOMO level than the HOMO level of the n-type semiconductor as an electron transport layer. Moreover, it is preferable to use a compound exhibiting high electron mobility from the viewpoint of transporting an electron.

The above-described electron transport layer is also called a hole block layer, and it is more preferable to use the electron transport layer which have such function. Examples of a material for that include: a phenanthrene system compound such as bathocuproine; an n-type semiconductor material such as naphthalenetetracarboxylic acid anhydride, naphthalenetetracarboxylic acid diimide, perylenetetracarboxylic acid anhydride and perylenetetracarboxylic acid diimide; an n-type inorganic oxide such as titanium oxide, zinc oxide and gallium oxide; and an alkali metal compound such as lithium fluoride, sodium fluoride and cesium fluoride. Moreover, the layer which consists of a single substance of an n-type semiconductor material used for the photoelectric conversion layer can also be used.

As a means to form these layers, although any one of a vacuum deposition method and a solution coating method can be used, it is preferably used the solution coating method.

[Positive Hole Transport Layer and Electron Block Layer]

The organic photoelectric conversion element of the present invention is preferably provided with a positive hole transport layer formed between a photoelectric conversion layer and a anode. This enable to take out more efficiently the electric charge generated in the photoelectric conversion layer.

As a material to constitute the aforesaid layers, there can be used for a positive hole transport layer, for example: PEDOT (product name Baytron™ made by Starck Vitec Co.), polyaniline and its dope material, and a cyan compound described in WO 06/019270. In addition, to the electron transport layer which has a LUMO level shallower than the LUMO level of the n-type semiconductor material used for a photoelectric conversion layer, there is provided an electron block function having an rectifying effect by which the electron generated in the photoelectric conversion layer is not passed to the anode side. The above-described positive hole transport layer is also called an electron block layer, and it is more preferable to use a positive hole transport layer having such function.

Examples of these materials include: a triaryl amine compound described in JP-A No. 5-271166, a metal oxide such as molybdenum oxide, nickel oxide and tungsten oxide. Moreover, the layer which consists of a single substance of a p-type semiconductor material used for the photoelectric conversion layer can also be used. As a means to form these layers, although any one of a vacuum deposition method and a solution coating method can be used, it is preferably used the solution coating method. When an underlayer is formed with a coating method before forming a photoelectric conversion layer, it will have an effect of leveling the coating surface. This will result in decreasing a leaking effect and it is preferable.

[Other Layers]

It is also adequate to make a composition containing various inter layers in an element for the purpose of improvement in energy conversion efficiency, and improvement in lifetime of an element. Examples of an interlayer include: a positive hole block layer, an electron block layer, a positive hole injection layer, an electron injection layer, an exciton block layer, a UV absorption layer, a light reflection layer and a wavelength conversion layer.

[Electrode]

In the organic photoelectric conversion element of the present invention, there are contained at least an anode and cathode. When a tandem composition is taken, the tandem composition can be achieved by using an intermediate. In addition, in the present invention, the electrode in which a positive hole mainly flows is called an anode, and the electrode in which an electron mainly flows is called cathode.

The electrodes may be divided by their function whether they have or does not have light transparency. An electrode with transparency is called a transparent electrode, on the other hand, an electrode without transparency is called a counter electrode. Usually, an anode is a transparent electrode with light transparency and a cathode is a counter electrode without light transparency.

[Anode]

The anode of the present invention is an electrode which preferably transmits light of 380 to 800 nm. Examples of a material used for that include: a transparent conductive metal oxide such as indium tin oxide (ITO), $SnO_2$ and ZnO; a metal thin film such as gold, silver and platinum; a metal nanowire; and a carbon nanotube.

A conductive polymer molecule selected from the group of derivatives of: polypyrrole, polyaniline, polythiophene, poly thienylene vinylene, polyazulene, polyisothianaphthene, polycarbazole, polyacethylene, polyphenylene, polyphenylene vinylene, polyacene, polyphenyl acetylene, polydiacetylene, and polynaphthalene. It can also be made an anode by combining a plurality of these conductive compounds.

[Cathode]

Although a cathode may be a conducting material independent layer, in addition to that, it may be added a resin to hold the conducting material. As a conducting material for a cathode, it is used an electrode material of a metal, an alloy, an electric conductive compound, and a mixture thereof which have a small work function. Specific examples of the electrode material include: sodium, sodium potassium alloy, magnesium, lithium, magnesium/copper mixture, magnesium/silver mixture, magnesium/aluminum mixture, magnesium/indium mixture, aluminum/aluminum oxide ($Al_2O_3$) mixture, indium, lithium/aluminum mixture, and rare earth metal.

Among these, from the viewpoints of a taking out property of an electron and resistance to oxidation, preferable is a mixture of these metals and the second metal which has a larger work function and is more stable than these metals. The cathode can be produces by forming a thin film by using a method such as vacuum vapor-deposition and sputtering of the electrode material. The thickness of the thin film is generally selected from 10 nm to 5 μm, and preferably it is selected from 50 to 200 nm.

When a metallic material is used as a conducting material for a cathode, the light arrived at the cathode side is reflected and it is reflected to the first electrode side. This light becomes possible to be recycled, and it is again absorbed by a photoelectric conversion layer. This is preferable because this results in more improvement of its photoelectric conversion efficiency.

A cathode may be made of: a metal (for example, gold, silver, copper, platinum, rhodium, ruthenium, an aluminum, magnesium and indium, nanoparticles made of carbon, nanowires and a nano structure. A dispersion of nanowires is preferable, since it can form a transparent cathode having high electro conductivity with a coating method.

When the cathode side is made into a light transmissive state, it can be made as follows. After producing a film of a conductive material suitable for a cathode, such as an aluminum and an aluminum alloy, silver, and a silver compound, to have a thickness of about 1 to 20 nm, for example, a trans parent cathode can be produced by providing with a film of a conductive light transmissive material cited for the description of the above-mentioned anode.

[Intermediate Electrode]

As a material for an intermediate electrode which is needed in a tandem composition as shown in the above-mentioned FIG. 3., preferable is a layer using the compound having both transparency and electro conductivity. It can be used a material used for the above-mentioned anode: a transparent metal oxide such as ITO, AZO, FTO or titanium oxide; a very thin metal layers made of such as Ag, aluminum and Au; a layer containing nanoparticles and nanowires; a conductive polymer material such as PEDOT:PSS and poly aniline.

In addition, among combinations of the aforesaid the positive hole transporting layer and electron transportation layer, there may be a combination which acts as an intermediate electrode (electric charge recombination layer) when they are suitable selected and laminated with each other. When such composition is realized, it is preferable since it can decrease one manufacturing process to be used for forming one layer.

[Substrate]

When the light by which photoelectric conversion is carried out enters from the substrate side, it is preferable that the substrate is made of a member enabling to transmit the light by which photoelectric conversion is carried out. That is, it is preferable that the substrate is made of a transparent member to the wave length of this light that should be carried out photoelectric conversion. As for a substrate, although a glass substrate and a resin substrate are cited suitably, it is preferable to use a transparent resin film from the viewpoints of lightness and flexibility. In the present invention, there is no restriction in particular to the transparent resin film which can be preferably used as a transparent substrate, and it can be suitably chosen from the known materials with respect to form, structure and thickness.

Specific examples of a resin film include: a polyester resin film such as polyethylene terephthalate (PET) and polyethylene naphthalate (PEN) and modified polyester; a polyolefin resin film such as a polyethylene (PE) resin film, a polypropylene (PP) resin film, a polystyrene resin film and a cyclic olefin resin; a vinyl resin film such as polyvinylchloride and polyvinylidene chloride; a polyether ether ketone (PEEK) resin film, a polysulfone (PSF) resin film, a polyethersulfone (PES) resin film, a polycarbonate (PC) resin film, a polyamide resin film, a polyimide resin film, an acrylic resin film and a triacetyl cellulose (TAC) resin film. If the resin film exhibits transmittance for the light of a visible range (380 to 800 nm) is 80% or more, it is preferably applicable to the transparent resin film concerning the present invention.

Especially, from the viewpoints of transparency, heat resistivity, ease of handling, strength and cost, the following resins are preferable: a biaxial stretching polyethylene terephthalate film, a biaxial stretching polyethylenenaphthalate film, a polyethersulfone film and a polycarbonate film. Among them, a biaxial stretching polyethylene terephthalate film and a biaxial stretching polyethylenenaphthalate film are more preferable.

In order to secure the wettability and the adhesion property of a coating solution, surface treatment can be performed and an adhesion assisting layer can be prepared to the transparent substrate used for the present invention. About surface treatment or an adhesion assisting layer, a well-known technique can be used conventionally. For example, as surface treatment, there can be cites a surface activation process such as: corona discharge treatment, flame treatment, ultraviolet treatment, high-frequency treatment, glow discharge process, activity plasma treatment and laser process.

Moreover, as an adhesion assisting layer, there can be cites: polyester, polyamide, polyurethane, vinyl system copolymer, butadiene system copolymer, acrylic system copolymer, vinylidene system copolymer and epoxy system copolymer. In order to control transmission of oxygen and water vapor, a barrier coat layer may be formed beforehand to the transparent substrate, and a hard court layer may be formed beforehand on the opposite side which is transferred a transparent conductive layer.

[Optical Function Layer]

The organic photoelectric conversion element of the present invention may be provided with a various types of optical function layers for the purpose of efficient light receiving of sunlight. As an optical function layer, there may be provided with an anti-reflection layer, a light condensing layer such as a microlens array, a light diffusion layer which can scatter the light reflected by the cathode and can make the light enter again in a power generation layer.

As an anti-reflection layer, well-known anti-reflection layer can be prepared. For example, when a transparent resin film is a biaxial stretching polyethylene terephthalate film, it is preferable to set the refractive index of the adhesion assisting layer, which is adjacent to the film, to be 1.57 to 1.63. This will improve transmittance with decreasing the interface reflection between the film substrate and the adhesion assisting layer. As a way of adjusting a refractive index, it can be carried out by adjusting suitably the ratio of a binder resin to oxide sol having a comparatively high refractive index such as a tin oxide sol and a cerium oxide sol and by coating it. Although a single layer of adhesion assisting layer may be sufficient, in order to raise adhesion property, a composition of two or more adhesion assisting layers may be used.

Examples of a light condensing layer are as follows: to set a structure of a micro lens array on the sunlight receiving side of the substrate; and to combine a so-called light condensing sheet to increase an amount of the receiving light from a specific direction, or conversely, to decrease incident angle dependability of sunlight.

As an example of a microlens array, it can be cited an arrangement in which the quadrangular pyramidal forms having a base of 30 μm and a vertex angle of 90 degrees are arranged in two dimensions on the light taking out side of a substrate. As for a base, the range of 10 to 100 μm is desirable. When it is smaller than this range, the effect of diffraction will occur to result in coloring, while when it is larger than this range, the thickness becomes large. They are not desirable.

Moreover, as a light scattering layer, a various types of anti-glare layers and a layer in which are distributed nanoparticles or nanowire made of metal or various inorganic oxides in a colorless transparent polymer can be cited.

[Patterning]

There is no restriction in particular to the way and the process of patterning an electrode, a power generation layer, a positive hole transport layer and an electron transport layer, etc. concerning the present invention, and a well-known approach can be applied suitably.

In the case of a soluble material used for a photoelectric conversion layer and a transport layer, only a unnecessary part may be wiped off after the complete application with a die coat, or a dip coat, or it may be directly patterned at the time of an application using the methods such as an ink-jet method or a screen printing.

In the case of an insoluble material used for an electrode material, mask deposition can be performed at the time of vacuum deposition, or it can be patterned by the well-known methods such as etching or lift-off. Moreover, it may be formed a pattern by transferring the pattern formed on another substrate.

[Sealing]

In order to prevent deterioration of the produced organic photoelectric conversion element by oxygen or water existing in an ambient, it is preferable to carry out sealing with a well-known approach not only in the filed of an organic photoelectric conversion element but also in the field of an organic electroluminescence element.

For example, the following methods can be cited: a method of carrying out sealing by pasting up the cap made of aluminum or glass with an adhesive agent; a method of adhering a plastic film in which a gas barrier layer made of aluminum, silicon oxide, or aluminum oxide has been formed, with an organic photoelectric conversion element with an adhesive agent; a method of spin coating a polymer material having a high gas barrier property (for example, polyvinyl alcohol); a method of depositing under a vacuum condition an inorganic thin film (for example, silicon oxide and aluminum oxide), or an organic layer (foe example, parylene) which has a high barrier property; and a method of laminating these layers by combining these methods.

(Optical Sensor Array)

Next, an optical sensor array adapting the bulk heterojunction type of organic photoelectric conversion element 10 described above will be described in details. An optical sensor array is a sensor which has the effect of changing into an electric signal the picture image which is projected on the optical sensor array produced by arranging the above-mentioned photoelectric conversion elements in the shape of fine pixels, by making use of generation of an electric current caused by the received light on the bulk heterojunction type of organic photoelectric conversion element.

Figure 4A:
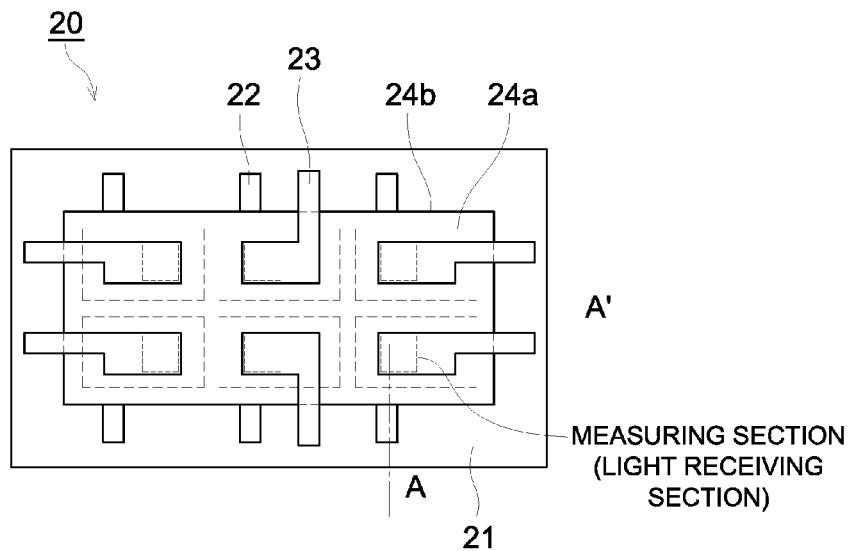
FIGS. 4a and 4b are drawings which show a composition of an optical sensor array.
Figure 4B:
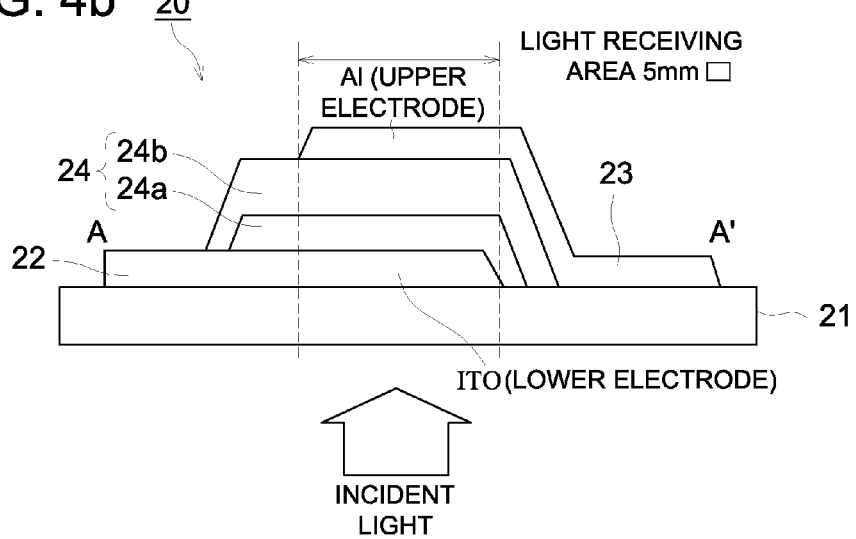

FIGS. 4a and 4b are drawings showing a composition of an optical sensor array. FIG. 4a is a top view and FIG. 4b is a cross-sectional view obtained by cutting through a line A-A' of FIG. 4a.

In FIGS. 4a and 4b, optical sensor array 20 has the following compositions, on substrate 21 used as a support member are sequentially laminated, transparent electrode 22 as a lower electrode, photoelectric conversion section 24 where photo energy is converted into electric energy, and counter electrode 23 as an upper electrode which forms a pair with transparent electrode 22. Photoelectric conversion section 24 is composed of two layers of: photoelectric conversion layer 24b containing a bulk heterojunction layer prepared by uniformly mixing a p-type semiconductor material and an n-type semiconductor material; and buffer layer 24a. In an example shown in FIG. 4a, six organic bulk heterojunction type photoelectric conversion elements are formed.

These members of substrate 21, transparent electrode 22, photoelectric conversion layer 24b and counter electrode 23 form a composition and perform a role equivalent to transparent electrode 12, photoelectric conversion section 14 and counter electrode 13 in photoelectric conversion element 10 of a bulk heterojunction type as mentioned above.

Glass is used for substrate 21, for example; ITO is used for transparent electrode 22, for example; and aluminum is used for counter electrode 23, for example. And the aforesaid BP-1 precursor is used for the p-type semiconductor material in photoelectric conversion layer 24b, for example; and the cross-linking polymerization reaction product of the above-mentioned exemplified compound 1 is used for then type semiconductor material, for example. Moreover, in buffer layer 24a, it is used a PEDOT (poly-3,4-ethylenedioxythiophene)-PSS (polystyrene sulfonic acid) conductive polymer (product name Baytron™ made by Starck Vitec Co.). Thus describe optical sensor array 20 was manufactured as follows.

An ITO film was formed by sputtering on a glass substrate, and a prescribed pattern shape was processed by photo lithography. The thickness of the glass substrate was 0.7 mm, the thickness of the ITO film was 200 nm, and an area of measuring section (light receiving area) formed after photo lithography on the ITO film was 5 mm×5 mm. Next, a PEDOT-PSS film was formed on this glass substrate 21 with a spin coat method (conditions; rotational frequency=1,000 rpm, diameter of filter=1.2 μm). Then, this substrate was heated and dried at 140° C. for 10 minutes in an oven. The thickness of the PEDOT-PSS film after drying was 30 nm.

Next, a 1:1 mixed film of the BP-1 precursor+the exemplified compound 1 was formed on the above-mentioned PEDOT-PSS film with a spin coat method (conditions; rotational frequency=3,300 rpm, diameter of filter=0.8 μm). On the occasion of this spin coat, it was used a mixture solution obtained from a tetrabenzoporphyrin derivative mixed with chlorobenzene with a ratio of 6:5 followed by subjected to ultrasonic agitation (for 5 minutes). After formation of the mixed film of the BP-1 precursor and the exemplified compound 1, the mixed film was subjected to an annealing treatment under a nitrogen gas atmosphere by heating at 180° C. for 30 minutes in an oven. The thickness of the cross-linking polymerization material containing the BP-1 precursor and the exemplified compound 1 after annealing treatment was 70 nm.

Then, an aluminum layer as an upper electrode was formed with a vacuum deposition method using a metal mask equipped with prescribed pattern openings on the mixed film of the cross-linking polymerization material containing the BP-1 precursor and the exemplified compound 1 (thickness=10 nm). Afterward, a passivation layer (not shown in Figs.) having a thickness of 1 μm was produced using PVA(s) (polyvinyl alcohol) with a spin coat method followed by calcination at 150° C. The optical sensor array 20 was produced by the above process.

EXAMPLES

Hereafter, the present invention will be described specifically by referring to examples, however, the present invention is not limited to them.

Example 1

The compounds used in Example 1 were synthesized as follows.

(P-Type Semiconductor Material Precursor: BP-1 Precursor)

According to Chemical Communications, vol. 22 (1999), p. 2275, a p-type semiconductor material precursor: BP-1 precursor was obtained.

(Phenyl-C61-Butyric Acid Glycidyl Ester (PCBG))

Phenyl-C61-butyric acid glycidyl ester (PCBG) was obtained according to Adv. Mater., vol. 20 (2008), p. 2116.

PCBG

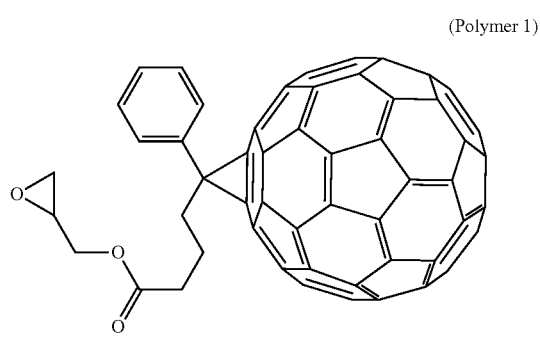

(Polymer 1)

Bis-PCBM was synthesized by referring to Adv. Mater., vol. 20 (2008), p. 2116. Subsequently, chlorinating reaction of bis-PCBM was performed to obtain the following monomer 1 by referring to J. Mater. Chem., vol. 15 (2005), p. 5158. And as shown by the following scheme, 0.95 equivalents of 2,5-bis(octyloxy)-1,4-bis(hydroxymethyl) benzene and 1 equivalent of monomer 1 were allowed to perform polycondensation reaction under existence of a base. After termination of the reaction, methanol was added to stop the reaction, and polymer 1 containing fullerene was obtained (Mn=5,500 as a PS conversion value).

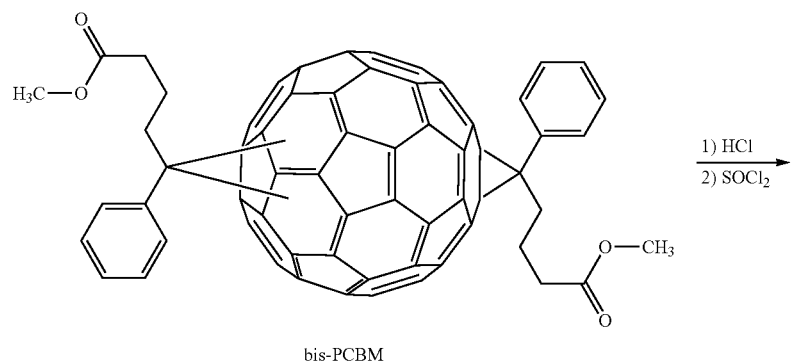

bis-PCBM

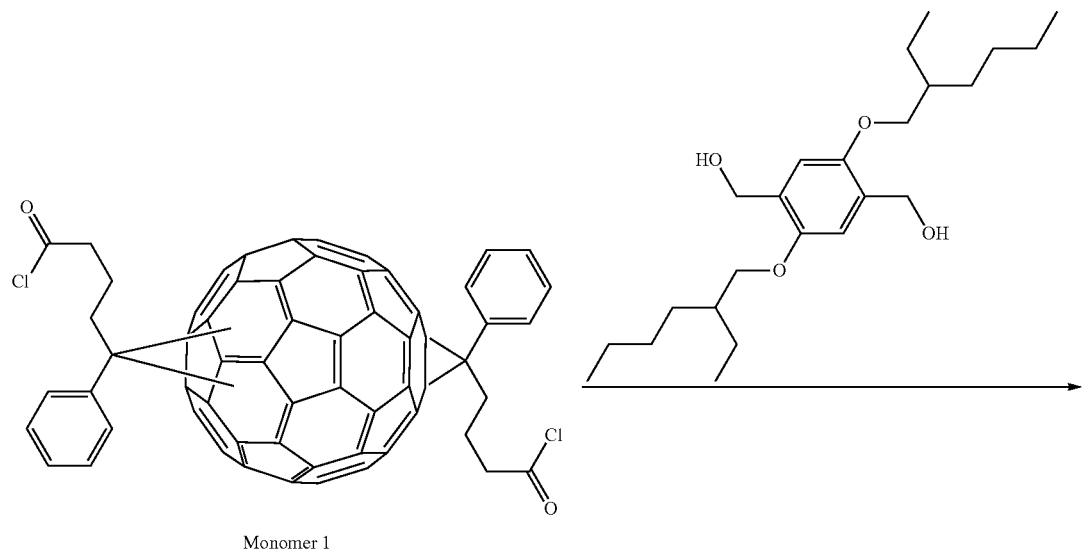

Monomer 1

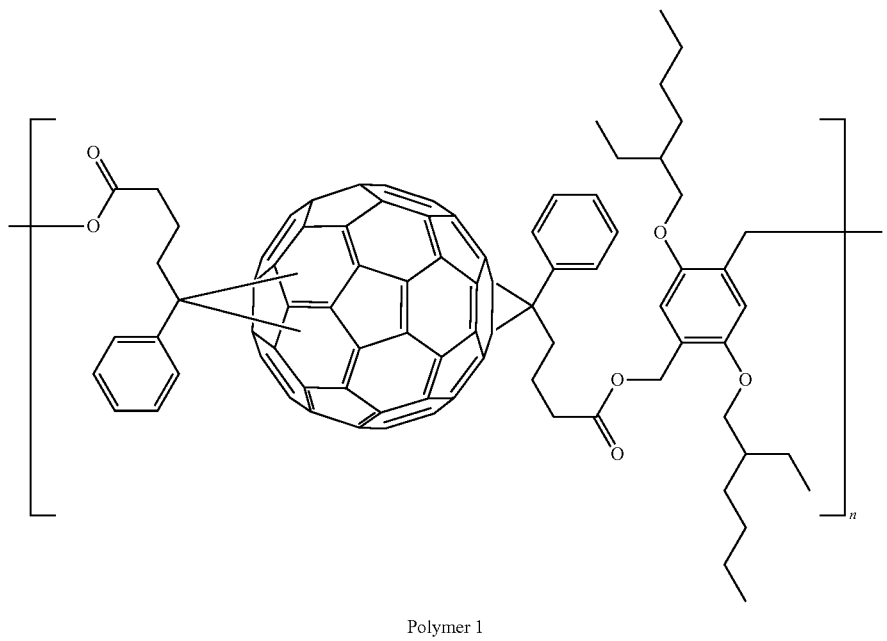

Polymer 1

Exemplified Compound 1

According to the following scheme, the monomer 1, (which is an intermediate compound for preparing the above-described polymer 1), and vinylalcohol were allowed to perform polycondensation reaction under existence of a base. The resulted product was purified with silica gel column chromatography to obtain exemplified compound 1.

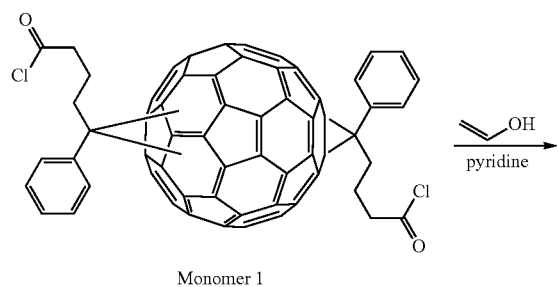

Monomer 1

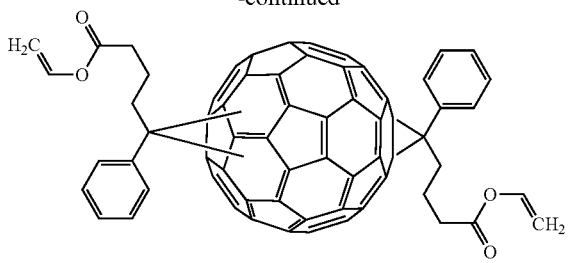

Exemplified compound 1

Exemplified Compound 7

The monomer 1, (which is an intermediate compound for preparing the above-described polymer 1), and glycidol were allowed to perform polycondensation reaction under existence of a base. The resulted product was purified with silica gel column chromatography to obtain exemplified compound 7.

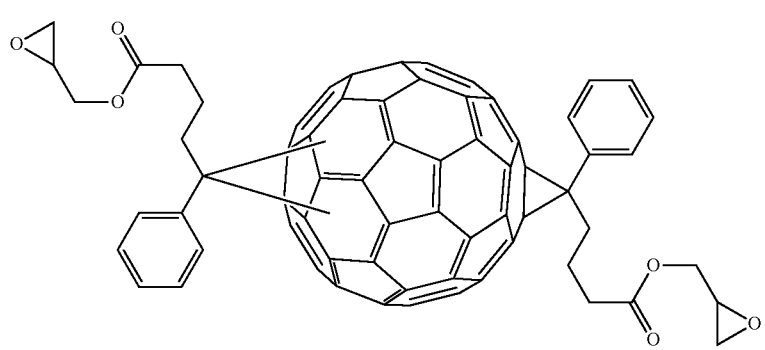

Exemplified compound 7

[Preparation of Organic Photoelectric Conversion Elements]

(Preparation of Organic Photoelectric Conversion Element 1)

A transparent conductive film made of indium tin oxide (ITO) was deposited on a glass substrate to have a thickness of 110 nm (sheet resistance: 13Ω/☐). By using a usual photolithography technique and hydrochloric acid etching, a transparent electrode having a pattern of 2 mm width was formed.

The transparent electrode which carried out pattern formation was successively cleaned by: ultrasonic cleaning using SEMICO-CLEAN made by Furuuchi Chemistry Co., ultrasonic cleaning using a surfactant and ultrapure water, and finally ultrasonic cleaning with ultrapure water. Then it was dried by a nitrogen blow, and finally UV light ozone cleaning was performed.

On the cleaned transparent electrode was applied a electric conductive polymer Baytron PH510™ (made by Starck Vitec Co.) with spin coating to have a film thickness of 30 nm. Then it was dried by heating at 140° C. for 10 minutes under the atmosphere.

After this, the substrate was carried in into a glove box and manipulations were done under a nitrogen atmosphere.

First, the above-mentioned substrate was subjected to heat treatment at 180° C. for 3 minutes under the nitrogen atmosphere. Next, there was prepared a liquid by dissolving 1.2 weight % of the BP-1 precursor of the above-mentioned p-type semiconductor material and 1.0 weight % of the following PCBM (Mw=911, low molecular n-type semiconductor material) in chlorobenzene. Subsequently, while filtering this solution with a 0.45 μm filter, this solution was applied with spin coating at 500 rmp for 1 second, followed by at 2,200 rpm for 60 seconds. After leaving the coated film at room temperature for 30 minutes, it was heated at 160° C. for 30 minutes to change the BP-1 precursor of the p-type semiconductor material into BP-1 (Mw=511, a low molecular weight p-type semiconductor material, the molecular weigh was reduced to about 5/6 after being changed to the low molecular weight p-type semiconductor compared to before the change).

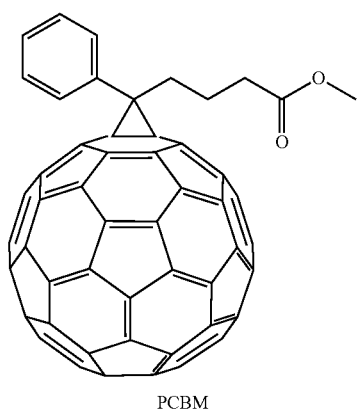

PCBM

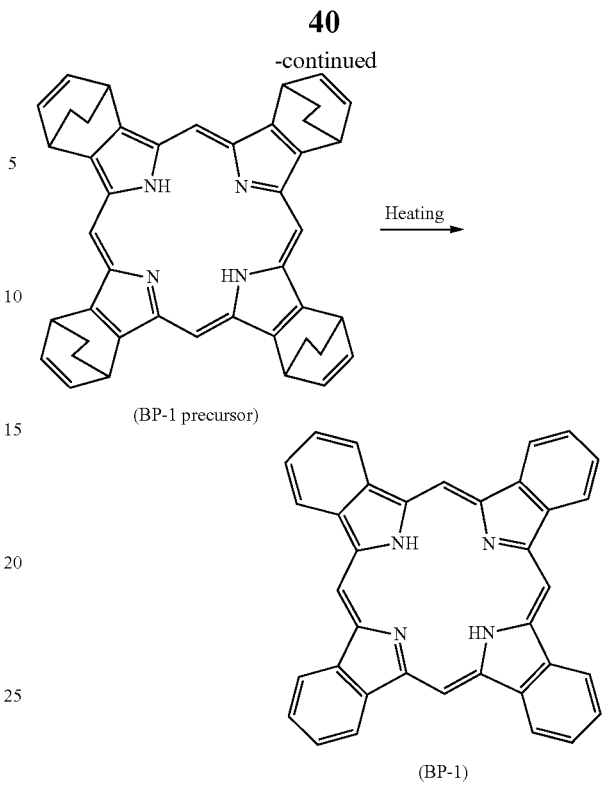

(BP-1 precursor)

(BP-1)

Next, the substrate on which were formed a series of the above-mentioned organic layers was installed in a vacuum vapor-deposition apparatus. After having set the element so that a transparent electrode and the shadow mask of 2 mm width might cross at right angles, the inner portion of the vacuum vapor-deposition apparatus was decompressed to be below to $10^{-3}$ Pa. Then, there were vapor-deposited lithium fluoride with a thickness of 5 nm and aluminum with a thickness of 80 nm with a vapor-deposition rate of 2 nm/second. Thus, organic photoelectric conversion element 1 having a size of 2 mm square was obtained. The obtained organic photoelectric conversion element 1 was performed sealing using an aluminum can and a UV curing resin under a nitrogen atmosphere.

(Preparation of Organic Photoelectric Conversion Element 2)

Organic photoelectric conversion element 2 was prepared in the same manner as preparation of the organic photoelectric conversion element 1, except that 12 weight % of the BP-1 precursor was replaced with 1.0 weight % of regioregular poly(3-hexylthiohene) having a number average molecular weight of 45,000 (P3HT, a polymer n-type semiconductor material, made by Rieke Metals Inc.). The prepared organic photoelectric conversion element 2 was sealed using an aluminum can and a UV curing resin under a nitrogen atmosphere.

(Preparation of Organic Photoelectric Conversion Element 3)

Organic photoelectric conversion element 3 was prepared in the same manner as preparation of the organic photoelectric conversion element 2, except that 1.5 weight % of PCBM (a low molecular weight n-type semiconductor) was replaced with 1.0 weight % of PCBG (a monomer for producing a polymer n-type semiconductor material). The prepared organic photoelectric conversion element 3 was sealed similarly using a glass sealing cap and a UV curing resin under a nitrogen atmosphere.

(Preparation of Organic Photoelectric Conversion Element 4)

Organic photoelectric conversion element 4 was prepared in the same manner as preparation of the organic photoelectric conversion element 1, except that 1.5 weight % of PCBM (a low molecular weight n-type semiconductor) was replaced with 1.0 weight % of PCBG (a monomer for producing a polymer n-type semiconductor material). PCBG was polymerized by heating at 160° C. for 30 minutes. The prepared organic photoelectric conversion element 4 was sealed similarly using an aluminum can and a UV curing resin under a nitrogen atmosphere.

(Preparation of Organic Photoelectric Conversion Element 5)

Organic photoelectric conversion element 5 was prepared in the same manner as preparation of the organic photoelectric conversion element 4, except that 1.0 weight % of PCBG was replaced with 1.0 weight % of polymer 1 (a polymer n-type semiconductor material). The prepared organic photoelectric conversion element 5 was sealed similarly using an aluminum can and a UV curing resin under a nitrogen atmosphere.

(Preparation of Organic Photoelectric Conversion Element 6)

Organic photoelectric conversion element 6 was prepared in the same manner as preparation of the organic photoelectric conversion element 4, except that 1.0 weight % of PCBG was replaced with 1.0 weight % of exemplified compound 1 (a monomer for producing a three-dimensional cross-linking polymer n-type semiconductor material). The exemplified compound 1 was polymerized by heating at 160° C. for 30 minutes. The prepared organic photoelectric conversion element 6 was sealed similarly using a glass sealing cap and a UV curing resin under a nitrogen atmosphere.

(Preparation of Organic Photoelectric Conversion Element 7)

Organic photoelectric conversion element 7 was prepared in the same manner as preparation of the organic photoelectric conversion element 4, except that 1.0 weight % of PCBG was replaced with 1.0 weight % of exemplified compound 7 (a monomer for producing a three-dimensional cross-linking polymer n-type semiconductor material). The exemplified compound 7 was polymerized by heating at 160° C. for 30 minutes to become a three-dimensional cross-linking polymer n-type semiconductor material. The prepared organic photoelectric conversion element 7 was sealed similarly using a glass sealing cap and a UV curing resin under a nitrogen atmosphere.

[Evaluation of Organic Photoelectric Conversion Elements]
(Evaluation of Organic Photoelectric Conversion Elements: Conversion Efficiency)

The organic photoelectric conversion element which performed sealing using a glass sealing cap and a UV curing resin was irradiated with a light of Solar Simulator (AM1.5G) with a power of 100 mW/cm$^2$. The voltage-electric current characteristics were measured, and photoelectric conversion efficiency was determined.

(Evaluation of Organic Photoelectric Conversion Elements: Durability)

Furthermore, by making in the state where a resistor was connected between the anode and the cathode of an organic photoelectric conversion element, the initial conversion efficiency and the conversion efficiency after irradiated for 100 hours with the above-described light having the power of 100 mW/cm$^2$ was compared to estimate the retention of the conversion efficiency. The evaluation was described in percentage.

The evaluation results are shown in Table 1.

TABLE 1

| Organic photoelectric conversion elements | n-type semiconductor material | p-type semiconductor material | Photoelectric conversion efficiency (%) | Durability (%) | Remarks |
|---|---|---|---|---|---|
| 1 | PCBM (Low molecular weight) | BP-1 (Low molecular weight) | 2.3 | 42 | Comparison |
| 2 | PCBM (Low molecular weight) | P3HT (Polymer) | 2.2 | 25 | Comparison |
| 3 | PCBG (Pendant type polymer) | P3HT (Polymer) | 1.3 | 36 | Comparison |
| 4 | PCBG (Pendant type polymer) | BP-1 (Low molecular weight) | 2.6 | 60 | Present invention |
| 5 | Polymer 1 (Main chain type polymer) | BP-1 (Low molecular weight) | 2.8 | 66 | Present invention |
| 6 | Exemplified compound 1 (Three-dimensional cross-linking polymer) | BP-1 (Low molecular weight) | 3.0 | 80 | Present invention |
| 7 | Exemplified compound 7 (Three-dimensional cross-linking polymer) | BP-1 (Low molecular weight) | 3.0 | 72 | Present invention |

The results in Table 1 show that the organic photoelectric conversion element of the present invention which was made by combining a polymer n-type semiconductor material and low molecular weight p-type semiconductor material has high photoelectric conversion efficiency. Furthermore, it is shown that the photoelectric conversion element in which the n-type semiconductor material forms three-dimensional network structure has high durability.

Example 2

Evaluation of Upper Layer Coating Resistance

On a glass substrate was applied a chlorobenzene solution dissolving the following p-type semiconductor material, n-type semiconductor material, or a mixture of p-type semiconductor material and n-type semiconductor material with a spin coating method. After heating at 160° C. for 30 minutes, spectral absorption of the prepared sample was measured with a spectral absorption instrument.

Subsequently, after dropping chlorobenzene on the obtained thin film and performing the spin coat at 1,500 rpm for 60 seconds, the evaluation of upper layer coating resistance was done from the result of spectral absorption measurement based on the following criteria.

A: Spectral absorption of the absorption maximum after a chlorobenzene application is retained in an amount of 95% or more.

B: Spectral absorption of the absorption maximum after a chlorobenzene application is retained in an amount of 80% or more.

C: Spectral absorption of the absorption maximum after a chlorobenzene application is retained in an amount of less than 80%.

The evaluation results are shown in Table 2.

TABLE 2

| Sample | p-type semiconductor material Compound | Ratio (%) | n-type semiconductor material Compound | Ratio (%) | Upper layer coating resistance | Remarks |
|---|---|---|---|---|---|---|
| 1 | P3HT | 1.0 | — | — | C | Reference |
| 2 | BP-1 precursor (Low molecular eight) | 1.2 | — | — | A | Reference |
| 3 | — | — | PCBM (Low molecular weight) | 1.0 | C | Reference |
| 4 | — | — | PCBG (Pendant type polymer) | 1.0 | C | Reference |
| 5 | — | — | Polymer 1 (Main chain type polymer) | 1.0 | C | Reference |
| 6 | — | — | Exemplified compound 1 (Three-dimensional cross-linking polymer) | 1.0 | A | Reference |
| 7 | — | — | Exemplified compound 5 (Three-dimensional cross-linking polymer) | 1.0 | A | Reference |
| 8 | P3HT (Polymer) | 1.0 | PCBM (Low molecular weight) | 1.0 | C | Comparison |
| 9 | P3HT (Polymer) | 1.0 | Exemplified compound 1 (Three-dimensional cross-linking polymer) | 1.0 | C | Comparison |
| 10 | BP-1 precursor (Low molecular eight) | 1.2 | PCBM (Low molecular weight) | 1.0 | C | Comparison |
| 11 | BP-1 precursor (Low molecular eight) | 1.2 | Polymer 1 (Main chain type polymer) | 1.0 | B | Present invention |
| 12 | BP-1 precursor (Low molecular eight) | 1.2 | Exemplified compound 1 (Three-dimensional cross-linking polymer) | 1.0 | A | Present invention |
| 13 | BP-1 precursor (Low molecular eight) | 1.2 | Exemplified compound 5 (Three-dimensional cross-linking polymer) | 1.0 | A | Present invention |

From the results of samples 6 and 7, it is shown that the exemplified compounds 1 and 5 were cross-linking polymerized by heating at 160° C. for 30 minutes, they became insolubilized to a solvent. Moreover, from the result of sample 2, it is shown that the BP-1 precursor also changed by healing to a low molecular weight compound insoluble to a solvent, and it has high solvent resistance.

In samples 8-13 which were examined the solvent resistance of the bulk heterojunction layer made by mixing the p-type semiconductor material and the n-type semiconductor material, it is shown that samples 11-13 having a bulk heterojunction layer made of the combination of the present invention exhibit high upper layer coating resistance. Especially, samples 12 and 13 which use a three-dimensional cross-linking polymer exhibit high upper layer coating resistance.

From these results, it was shown that that the composition of the organic thin film photoelectric conversion element was able to be manufactured with a coating method of high manufacturing aptitude. This high upper layer coating resistance is particularly useful when a p-i-n type element or a tandem type photoelectric conversion element is produced. These elements can achieve higher photoelectric conversion efficiency.

Example 3

Preparation of Tandem Element

In the organic photoelectric conversion element 6 of the present invention of Example 1, after coating a bulk heterojunction layer and followed by heating at 160° C. for 30 minute, the step of vapor-depositing lithium fluoride and aluminum was replaced with coating with a titanium oxide layer as follows.

After preparing a liquid by dissolving Ti-isopropoxide in ethanol to become a content of 0.05 mol/L, and applying masking, spin coating was carried out so that the film thickness might become 10 nm. Then the sample was taken out in the air and was left for 30 minutes to form a titanium oxide layer.

Again, after applying Baytron PH510™ (made by Starck Vitec Co.) with spin coating to have a film thickness of 30 nm, it was dried by heating at 140° C. for 10 minutes under the atmosphere. Then, the sample was transferred in a glove box again.

Next, a second bulk heterojunction layer was produced by using a chlorobenzene solution dissolving regioregular poly (3-hexylthiohene) (P3HT, made by Rieke Metals Inc.) in an amount of 1.0 weight % and PCBM in an amount of 0.8 weight %.

The substrate on which were formed a series of the above-mentioned organic layers was installed in a vacuum vapor-deposition apparatus. After having set the element so that a transparent electrode and the shadow mask of 2 mm width might cross at right angles, the inner portion of the vacuum vapor-deposition apparatus was decompressed to be below to $10^{-3}$ Pa. Then, there were vapor-deposited lithium fluoride with a thickness of 5 nm and aluminium with a thickness of 80 nm with a vapor-deposition rate of 2 nm/second. Thus, organic photoelectric conversion element 14 of a tandem type having a size of 2 mm square was obtained. The obtained organic photoelectric conversion element 14 was performed sealing using an aluminium can and a UV curing resin under a nitrogen atmosphere.

The obtained organic photoelectric conversion element 14 showed photoelectric conversion efficiency of 3.6%. By making a tandem structure, it was possible to obtain an organic photoelectric conversion element having conversion efficiency higher than a organic photoelectric conversion element having a single bulk heterojunction layer.

Thus described above, it was found that the organic photoelectric conversion element of the present invention can be also applied to the organic photoelectric conversion element of a tandem type since it excels in lamination property, and higher photoelectric conversion efficiency can be acquired.

| | DESCRIPTION OF SYMBOLS |
|---|---|
| 10: | organic photoelectric conversion element of a bulk heterojunction type |
| 11: | substrate |
| 12: | anode |
| 13: | cathode |
| 14: | photoelectric conversion layer |
| 14p: | p layer |
| 14i: | i layer |
| 14n: | n layer |
| 14': | first photoelectric conversion layer |
| 15: | charge recombination layer |
| 16: | second photoelectric conversion layer |
| 17: | positive hole transport layer |
| 18: | electron transport layer |
| 20: | photo sensor array |
| 21: | substrate |
| 22: | anode |
| 23: | cathode |
| 24: | photoelectric conversion section |
| 24a: | buffer layer |
| 24b: | photoelectric conversion layer |

The invention claimed is:

1. An organic photoelectric conversion element comprising a bulk hetero unction layer containing a mixture of an n-type semiconductor material and a p-type semiconductor material,
wherein the n-type semiconductor material is a polymer represented by Formula (1) and the p-type semiconductor material is a tetrabenzoporphyrin derivative selected from the group consisting of BP-1, -2 and BP-3, Formula (1):

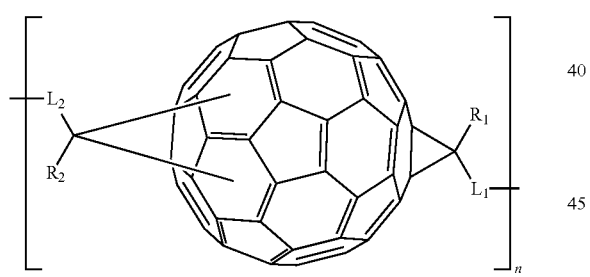

wherein, $R_1$ and $R_2$ each represent a substituent selected from the group consisting of a substituted or unsubstituted alkyl group, cycloalkyl group, aralkyl group, aryl group, heteroaryl group and silyl group; $L_1$ and $L_2$ each represent a substituted or unsubstituted alkylene group, alkenediyl group, alkynediyl group, cycloalkylene group, arylene group, heteroarylene group, silylene group, ether group, thioether group, carbonyl group, carboxyl group, amino group, amide group, or a structure containing a plurality of the foregoing groups connected with each other; and n is an integer of 2 or more, provided that Formula (1) shows one hemispherical portion among a spherical fullerene structure and the other hemispherical portion is omitted, and a spatial relationship of a first substituent containing $R_1$ and $L_1$ to a second substituent containing $R_2$ and $L_2$ in the fullerene structure is arbitrary,

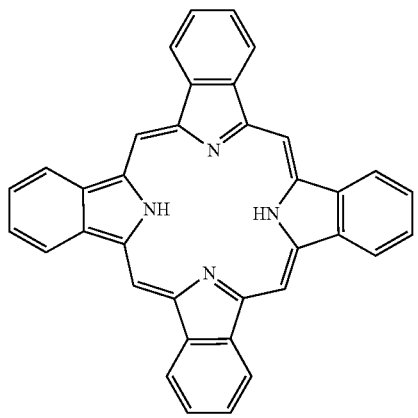

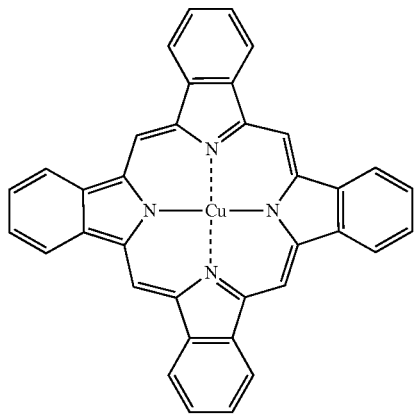

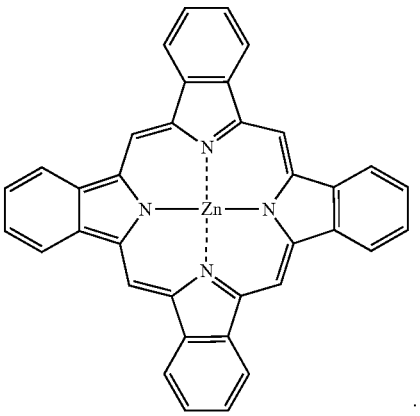

2. The organic photoelectric conversion element of claim 1, wherein the polymer forms a three-dimensional network structure.

3. The organic photoelectric conversion element of claim 1, wherein the p-type semiconductor material is a compound formed by heating a p-type semiconductor material precursor to change a chemical structure to convert into the p-type semiconductor material.

4. The organic photoelectric conversion element of claim 1, wherein the bulk heterojunction layer is made from a solution dissolving:
the p-type tetrabenzoporphyrin derivative or a precursor thereof; and
the n-type polymer represented by Formula (1) or a precursor thereof.

5. The organic photoelectric conversion element of claim 4, wherein the bulk heterojunction layer is made by the steps of:

forming a layer using a solution dissolving:

the p-type tetrabenzoporphyrin derivative or a precursor thereof; and the n-type polymer represented by Formula (1) or a precursor thereof, and heating the formed layer.

6. The organic photoelectric conversion element of claim 1, comprising a multiplicity of the bulk heterojunction layers.

7. A solar cell comprising the organic photoelectric conversion element of claim 1.

8. An optical sensor array comprising the organic photoelectric conversion element of claim 1, arranged in an array structure.

9. An organic photoelectric conversion element comprising a bulk heterojunction layer containing a mixture of an n-type semiconductor material and a p-type semiconductor material, wherein the p-type semiconductor material is a tetrabenzoporphyrin derivative selected from the group consisting of BP-1, BP-2 and BP-3 and the n-type semiconductor material is a polymer containing a fullerene compound which forms a three-dimensional network structure and is made by cross-linking polymerization using a monomer represented by the following Formula (2):

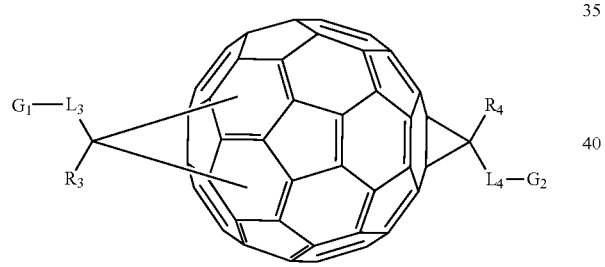

wherein, $R_3$ and $R_4$ each represent a substituent selected from the group consisting of a substituted or unsubstituted alkyl group, cycloalkyl group, aralkyl group, aryl group, heteroaryl group and silyl group; $L_3$ and $L_4$ each represent a substituted or unsubstituted alkylene group, alkenediyl group, alkynediyl group, cycloalkylene group, arylene group, heteroarylene group, silylene group, ether group, thioether group, carbonyl group, carboxyl group, amino group, amide group, or a structure containing a plurality of the foregoing groups connected with each other; and $G_1$ and $G_2$ each represent a polymerizable group which forms a linking chain of a three-dimensional network structure, provided that Formula (2) shows one hemispherical portion among a spherical fullerene structure and the other hemispherical portion is omitted, and a spatial relationship of a first substituent containing $G_1$, $R_3$ and $L_3$ to a second substituent containing $G_2$, $R_4$ and $L_4$ in the fullerene structure is arbitrary,

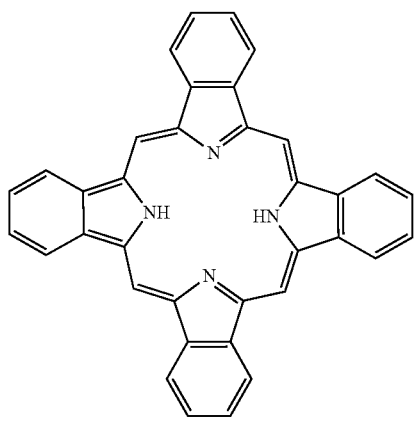

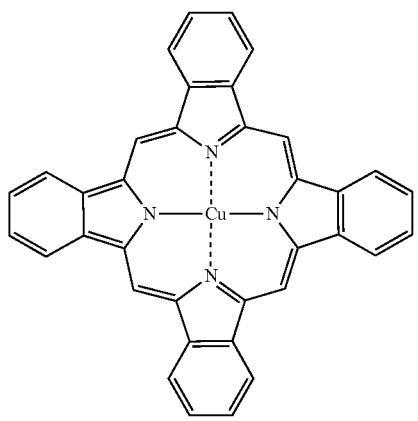

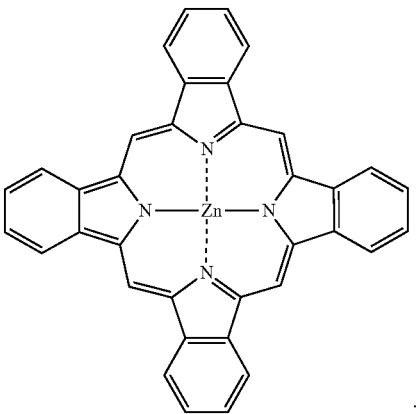

10. The organic photoelectric conversion element of claim 9, wherein $G_1$ and $G_2$ in Formula (2) are a vinyl group.

11. The organic photoelectric conversion element of claim 9, wherein the p-type semiconductor material is a compound formed by heating a p-type semiconductor material precursor to change a chemical structure to convert into the p-type semiconductor material.

12. The organic photoelectric conversion element of claim 9, comprising a multiplicity of the bulk heterojunction layers.

13. A solar cell comprising the organic photoelectric conversion element of claim 9.

14. An optical sensor array comprising the organic photoelectric conversion element of claim 9, arranged in an array structure.

* * * * *